(12) United States Patent
Kobayashi et al.

(10) Patent No.: US 6,588,005 B1
(45) Date of Patent: Jul. 1, 2003

(54) METHOD OF MANUFACTURING SEMICONDUCTOR INTEGRATED CIRCUIT DEVICE

(75) Inventors: Kazuhiko Kobayashi, Kodaira (JP); Kou Miyazaki, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/857,771

(22) PCT Filed: Dec. 11, 1998

(86) PCT No.: PCT/JP98/05619

§ 371 (c)(1), (2), (4) Date: Jun. 11, 2001

(87) PCT Pub. No.: WO00/36466

PCT Pub. Date: Jun. 22, 2000

(51) Int. Cl.[7] .................................. G06F 15/00
(52) U.S. Cl. ............................. 716/12; 716/19
(58) Field of Search ................. 716/12, 6, 19

(56) References Cited

U.S. PATENT DOCUMENTS

| | | | | |
|---|---|---|---|---|
| 5,358,807 A | * | 10/1994 | Okamoto | 430/5 |
| 5,538,815 A | * | 7/1996 | Oi et al. | 430/5 |
| 5,761,075 A | * | 6/1998 | Oi et al. | 364/488 |

FOREIGN PATENT DOCUMENTS

| | | |
|---|---|---|
| JP | 5-304211 | 11/1993 |
| JP | 6-035171 A | 2/1994 |
| JP | 6-085202 A | 3/1994 |
| JP | 7-013326 A | 1/1995 |
| JP | 7-234500 A | 9/1995 |
| JP | 9-152709 A | 6/1997 |

* cited by examiner

*Primary Examiner*—David Nelms
*Assistant Examiner*—Thao Le
(74) *Attorney, Agent, or Firm*—Antonelli, Terry, Stout & Kraus, LLP

(57) ABSTRACT

A wiring pattern is divided into sets of long wiring (L1) and sets of short wiring (Ls) by comparison to a reference value. Layout rules of the sets of long wiring (L1) are made different from layout rules of the sets of short wiring (Ls) by using an effect of a Levenson type phase shift. Thereby, an interval ($S_1$) between a set of long wiring (L1) and a set of short wiring (Ls) is made relatively narrower than an interval ($S_2$) between a set of long wiring (L1) and a set of long wiring (L1).

5 Claims, 16 Drawing Sheets

L1: LONG WIRING
LS: SHORT WIRING
S1: INTERVAL BETWEEN A SET OF LONG WIRING AND A SET OF SHORT WIRING
S2: INTERVAL BETWEEN SETS OF LONG WIRING

Ll: LONG WIRING
LS: SHORT WIRING
S1: INTERVAL BETWEEN A SET OF LONG WIRING AND A SET OF SHORT WIRING
S2: INTERVAL BETWEEN SETS OF LONG WIRING

☐ RECTANGULAR REGION

----- WIRING TRACK OF 0° IN PHASE

——— WIRING TRACK OF 180° IN PHASE

METHOD OF MANUFACTURING SEMICONDUCTOR INTEGRATED CIRCUIT DEVICE

TECHNICAL FIELD

The present invention relates to a semiconductor integrated circuit device and a manufacturing method thereof, and particularly relates to a technique effectively applied to a semiconductor integrated circuit device having a wiring pattern formed by a lithography technique adopting a phase shift and to a manufacturing technique therefor.

BACKGROUND ART

A lithography technique adopting a Levenson type phase shift capable of improving resolution by ensuring a fixed focal depth has been studied as one of methods of forming a fine wiring pattern.

There have been proposed several methods of arranging phase shifters for a phase shift mask. For example, Japanese Patent Laid-open No. 7-234500 by Ohi et al. discloses a method of executing compaction, in which patterns have the same phase, other patterns between and adjacent to the patterns are given as opposite a phase as possible, and the condition is added that the shortest distance S1 between the other patterns having the opposite phase is below the shortest distance S2 between the patterns having the same phase (S1<S2).

Further, Japanese Patent Laid-open No. 9-152709 by Sawada discloses a method of selecting sequentially phase-undefined patterns, determining phases of the selected patterns in accordance with adjacent pattern phase information thereof so as to be different from phases which most patterns adjacent to the selected patterns have, and updating contents of data of the determined phases.

In addition, Japanese Patent Laid-open No. 6-85202 by Tanaka et al. discloses a method of designing placement of phase shifters in a direction of each shorter dimension of patterns so that relationships between phases of light beams emitted from both openings and other openings adjacent thereto are always opposite to each other.

Also, Japanese Patent Laid-open No. 5-304211 by Itoh discloses a method of connecting a set of boundary wiring formed by making amounts of phase shift changed gradually, to one set of wiring formed by a phase shift method and the other set of wiring formed by no phase shift method.

Further, Japanese Patent Laid-open No. 7-13326 by Ohi et al. discloses a method of obtaining an adjacency relationship depending on whether the shortest length between figures corresponding to transparent regions in mask layout data is below a certain threshold value, giving a weight to each of portions becoming closed loops constituting odd nodes in accordance with the adjacency relationship, and thereby determining the phase of light with respect to the respective transparent regions.

Moreover, Japanese Patent Laid-open No. 6-35171 by Takekuma discloses a method of separating pattern data into an actual pattern data layer and a phase shift pattern data layer, and then verifying a mask pattern.

DISCLOSURE OF THE INVENTION

Although it is possible to narrow wiring placement intervals by using the above-mentioned Levenson type phase shift, there occurs the problem that parasitic capacity (coupling capacity) between sets of wiring increases and thereby delay time of each set of wiring increases.

Further, when a phase shift mask is manufactured, because a designer must redesign each shape, dimension, and position of phase shifters and must manually rearrange the phase shifters relative to contradictory portions which cannot invert a phase, a step of designing a mask pattern requires longer time.

An object of the present invention is to provide a technique capable of preventing the parasitic capacity between the sets of wiring from increasing, and capable of narrowing the wiring placement intervals.

Another object of the present invention is to provide a technique capable of efficiently carrying out phase shift mask design operation.

These and other objects of the present invention as well as novel features of the present invention will be readily apparent from the description of the present specification and accompanying drawings.

Among the inventions disclosed in the present application, typical inventions will be outlined briefly as follows.

(1) According to the semiconductor integrated circuit device of the present invention, a set of wiring transferred by Levenson type phase shift exposure and included in an automatic routing region is constituted by a first wiring group having a first width and a second wiring group having a second width; and said first width is relatively larger than said second width.

(2) According to the semiconductor integrated circuit device of the present invention based on above-mentioned (1), an interval between a set of first wiring and a set of second wiring is narrower than a minimum wiring interval provided without using Levenson type phase shift, the set of second of wiring being put between the adjacent sets of first wiring.

(3) According to the semiconductor integrated circuit device of the present invention based on above-mentioned (2), said first wiring is longer than said second wiring.

(4) According to the semiconductor integrated circuit device of the present invention based on above-mentioned (3), plural sets of second wiring are placed between a pair of sets of first wiring adjacent to each other.

(5) According to the semiconductor integrated circuit device of the present invention, a set of signal wiring placed in a wiring region formed in a semiconductor chip is divided into a set of long wiring and a set of short wiring by comparison with a reference value; and said set of long wiring is arranged in parallel to said set of short wiring and in proximity to at least one side of said set of short wiring.

(6) According to the semiconductor integrated circuit device of the present invention based on above-mentioned (5), an interval between said set of long wiring and said set of short wiring provided in parallel and in proximity thereto is narrow relatively narrower than an interval between sets of long wiring provided in parallel to each other.

(7) According to the semiconductor integrated circuit device of the present invention based on above-mentioned (5), a width of said set of short wiring is 0.3 to 1.0 times as large as a width of said set of long wiring.

(8) According to the semiconductor integrated circuit device of the present invention based on above-mentioned (6), a width of said set of short wiring is 0.3 to 1.0 times as large as a width of said set of long wiring.

(9) According to the semiconductor integrated circuit device of the present invention based on above-mentioned (5), wiring layer constituting a set of signal wiring extending in lateral direction differs from a wiring layer constituting a set of signal wiring extending in longitudinal direction; and the wiring layer extending in the lateral direction and the wiring layer extending in the longitudinal direction, which constitute one-net, are connected to each other through a contact hole provided in an interlayer insulating film between said wiring layer extending in the lateral direction and said wiring layer extending in the longitudinal direction.

(10) According to the semiconductor integrated circuit device of the present invention based on above-mentioned (5), said reference value is K times as high as an average value of spreads of a net in the wiring region, M times as large as a width of an interior of the wiring region, N% of the spread of the net on a shorter side in a wiring length distribution, one of an allowable length of the set of short wiring in view of resistance characteristics determined by a current density of the set of wiring and an allowable length of the set of long wiring in view of capacitive characteristics, and a combination thereof.

(11) The manufacturing method of the semiconductor integrated circuit device of the present invention, comprises the steps of: having a first wiring group with a first width and a second wiring group with a second width; and transferring a wiring pattern in an automatic routing region by Levenson type phase shift exposure, the wiring pattern in which said first width is relatively larger than said second width.

(12) According to the manufacturing method of the semiconductor integrated circuit device of the present invention based on above-mentioned (11), an interval between a set of first wiring and a set of second wiring is narrower than a minimum wiring interval provided without using Levenson type phase shift, the set of second wiring being put between the adjacent sets of first wiring.

(13) According to the manufacturing method of the semiconductor integrated circuit device of the present invention based on above-mentioned (12), said first wiring is longer than said second wiring.

(14) According to the manufacturing method of the semiconductor integrated circuit device of the present invention based on above-mentioned (13), plural sets of second wiring are placed between a pair of sets of first wiring adjacent to each other.

(15) The manufacturing method of the semiconductor integrated circuit device of the present invention, comprises the steps of: dividing a set of signal wiring into a set of long wiring and a set of short wiring by comparison with a reference value; arranging said set of long wiring in parallel to said set of short wiring and in proximity to at least one side of said set of short wiring; and forming a set of signal wiring in a wiring region included in a semiconductor chip.

(16) The manufacturing method of the semiconductor integrated circuit device of the present invent jased on above-mentioned (15), further comprises the steps of: making a layout rule of said set of long wiring different from a layout rule of said set of short wiring; and making an interval between a set of long wiring and a set of short wiring provided in parallel and in proximity thereto relatively narrower than an interval between sets of long wiring arranged in parallel to each other, by using a Levenson type phase shifter to expose a pattern of said set of short wiring on a photomask.

(17) The manufacturing method of the semiconductor integrated circuit device of the present invention based on above-mentioned (15), further comprises the steps of: making a layout rule of said set of long wiring different from a layout rule of said set of short wiring; and making a width of said set of short wiring 0.3 to 1.0 times as large as a width of said set of long wiring, by using a Levenson type phase shifter to expose a pattern of said set of short wiring on a photomask.

(18) The manufacturing method of the semiconductor integrated circuit device of the present invention based on above-mentioned(16), further comprises the steps of: making a layout rule of said set of long wiring different from a layout rule of said set of short wiring; and making a width of said set of short wiring 0.3 to 1.0 times as large as a width of said set of long wiring, by using a Levenson type phase shifter to expose a pattern of said set of short wiring on a photomask.

(19) The manufacturing method of the semiconductor integrated circuit device of the present invention based on above-mentioned (15), further comprises the steps of: making a wiring layer constituting a set of signal wiring extending in lateral direction different from a wiring layer constituting a set of signal wiring extending in longitudinal direction; and connecting the wiring layer extending in the lateral direction and the wiring layer extending in the longitudinal direction, which constitute one net, through a contact hole provided in an interlayer insulating film between said wiring layer extending in the lateral direction and said wiring layer extending in the longitudinal direction.

(20) According to the manufacturing method of the semiconductor integrated circuit device of the present invention based on above-mentioned. (15), said reference value is K times as high as an average value of spreads of a net in the wiring region, M times as large as a width of an interior of the wiring region, N% of the spread of the net on a shorter side in a wiring length distribution, one of an allowable length of the set of short wiring in view of resistance characteristics determined by a current density of the set of wiring and an allowable length of the set of long wiring in view of capacitive characteristics, and a combination thereof.

The other features of the present invention will be described according to items as follows:

1. A photomask design method for manufacturing the semiconductor integrated circuit device of the present invention has the step of:
   (a) dividing a wiring region included in a semiconductor chip into rectangular regions;
   (b) dividing a set of signal wiring into a set o long wiring and a set of short wiring in longitudinal and lateral directions, respectively, by comparison with a reference value;
   (c) allocating the set of long wiring to wiring region so that said set of long wiring is averagely present without detoruing;
   (d) alternately allocating wiring tracks of 0° in pahse and wiring tracks of 180° in phase in the longitudinal and lateral directions to said region, respectively;
   (e) allocating said set of long wiring to wiring tracks 0° in phase, and said set of short wiring tracks of 180° in phase; and
   (f) making a layout rule of said set of long wiring different from a layout rule of said set of short wiring in layout design, and determining coordinates of said set of long wiring and said set of short wiring by using an effect of Levenson type phase shift.

2. A photomask desing method for manufacturing the semiconductor integrated circuit device of the present invention has the step of:

(a) dividing a wiring region included in a semiconductor chip into rectangular regions;

(b) dividing a set of signal wiring into a set of long wiring and a set of short wiring in longitudinal and lateral directions, respectively, by comparison with a reference value;

(c) allocating said set of long wiring to a wiring region so that said set of long wiring is averagely present without detouring;

(d) alternately allocating wiring tracks 0° in phase and wiring tracks of 180° in phase in the longitudinal and lateral directions to said wiring region, respectively;

(e) allocating said set of long wiring to the wiring tracks 0° in phase, and the set of short wiring to wiring tracks 180° in phase;

(f) correcting allotment of said set of long wiring; and (g) making a layout rule of said set of long wiring different from a layout rule of the set of short wiring in layout desing, and determining coordinates of the set of long wiring and the set of short wiring by using an effect of a Levenson type phase shift.

3. A photomask desing method for manufacturing the semiconductor integrated circuit device of the present invention has the steps of:

(a) dividing a wiring region included in a semiconductor chip into regular regions;

(b) dividing a set of signal wiring into a set of long wiring and a set of short wiring in longitudinal and lateral directions, respectively, by comparison to a reference valure;

(c) allocating the set of long wiring to a wiring region so that said set of long wiring is averagely present without detouring;

(d) altenately allocating wiring tracks of 0° in phase and wiring tracks of 180° in phase in the longitudinal and lateral directions to said wiring region, respectively;

(e) allocating said set of long wiring to said wiring tracks 0° in phase, and said set of short wiring to said tracks 180° in phase;

(f) making a layout rule of said set of long wiring different from a layout rule of said set of short wiring in layout design, placing the set of long wiring and the set of short wiring so as to make an interval between a set of long wiring and a set of short wiring provided in parallel and in proximity to each other relatively narrower than an interval between sets of long wiring provided in parallel to each other by using an effect of a Levenson phase shift, and determining coordinates thereof.

4. According to a photomask design method for manufacturing the semiconductor integrated circuit device of the present invention based on the photomask design method recited in above-mentioned item 1, a width of said sdet of short wiring is 0.3 to 1.0 times as large as a width of said set of long wiring.

5. According to a photomask design method for manufacturing the semiconductor integrated circuit device of the present invention based on the photomask design method recited in above-mentioned item 2, a width of said set of short wiring is 0.3 to 1.0 times as large as a width of said set of long wiring.

6. According to a photomask design method for manufacturing the semiconductor integrated cirucit device of the present invention based on the photomask design method recited in above-mentioned item 3, a width of said set of short wiring is 0.3 to 1.0 times as large as a width of said set of long wiring.

7. According to a photomask design method for manufacturing the semiconductor integrated circuit device of the present invention based on the photomask design method recited in above-mentioned item 1, the set of long wiring placed on the wiring track of 0° in phase is designed according to a layout rule not using a phase shifter, and the set of short wiring placed on the wiring tracks of 180° in phase are designed according to a layout rule using the phase shifter.

8. According to a photomasd design method for manufacturing the semiconductor integrated circuit device of the present invention based on the photomask design method recited in above-mentioned item 2, the set of long wiring placed on the wiring track of 0° in phase are designed according to a layout rule not using a phase shifter, and the set of short wiring placed on the wiring track of 180° in phase are designed according to a layout rule using the phase shifter.

9. According to a photomask design method for manufacturing the semiconductor integrated circuit device of the present invention based on the photomask design method recited in above-mentioned item 3, the set of long wiring placed on the wiring track of 0° in phase is designed according to a layout rule not using a phase shifter, and the set of short wiring placed on the wiring track of 180° in phase is designed according to a layout rule using the phase shifter.

10. According to a method of designeing a photomask for manufacturing the semiconductor integrated circuit device of the present invention based on the photomask design method recited in above-mentioned item 1, one of an interval between the sets of long wiring and an interval between the sets of short wiring allotted to the same wiring track so as to be adjacent to each other is set to be equal to or larger than a minimum processed dimension which can be processed without using the Levenson type phase shift.

11. According to a method of designing a photomask for manufacturing the semiconductor integrated circuit device of the present invention based on the photomask design method recited in above-mentioned item 2, one of an interval between the sets of long wiring and an interval between the sets of short wiring allotted to the same wiring track so as to be adjacent to each other is set to be equal to or larger than a minimum processed dimension which can be processed without using the Levenson type phase shift.

12. According to a method of designing a photomask for manufacturing the semiconductor integrated circuit device of the present invention based on the photomask design method recited in above-mentioned item 3, one of an interval betrween the sets of long wiring and an interval between the sets of short wiring alotted to the same wiring track to be adjacent to each other is set to be equal to or wider than a minimum processed dimension which can be processed without using the Levenson type phase shift.

13. According to a photomask design method for manufacturing the semiconductor integrated circuit devie of the present invention based on the photomask design method recited in above-mentioned item 1, a wiring layer consituting a set of signal wiring extending in lateral direction is made different from a wiring layer consistuting a set of signal wiring extending in longitudinal direction, and the wiring layer extending in the lateral direction and the wiring layer extending in the longitudinal direction, which consitute one net, are connected through a contact hole provided in an interlayer Insulating film between said wiring layer extending in the lateral direction and said wiring layer extending in the longitudinal direction.

14. According to a photomask dsign method for manufacuting the semiconductor integrated circuit device of the present invention based on the photomask design method recited in above-mentioned item 2, a wiring layer consituting a set of signa wiring extending in lateral direction is made different from a wiring layer constituing a set of signal wiring extending in longitudinal direction, and the wiring layer extending in the lateral direction and the wiring layer extending in the longitudinal directino, which consitute one net, are connected through a contact hole provided in an interlayer insulating film between said wiring layer extending in the lateral direction and said wiring layer extending in the longitudinal direction.

15. According to a photomask design method for manufacturing the semiconductor integrated circuit device of the present invention based on the photomask design method recited in above-mentioned item 3, a wiring layer constituting a set of signal wiring extending in lateral direction is made different from a wiring layer constituing a set of signal wiring extending in longitudinal direction, and the wiring layer extending in the lateral directin and the wiring layer extending in the longtiudinal direction, which constitute on net, are connected through a contact h ole provided in an interlayer insulating film between said wiring layer extending in the lateral directin and said wiring layer extending in the longitudinal direction.

16. According to a photomask design method for manufacturing the semiconductor integrated circuit device of the present invention based on the photomask design method recited in above-mentioned item 1, said reference value is K times as high as an average value of the spread of nets in the wiring region, M times as large as a width of an interior of the wiring region, N% of the spread of the nets on a shorter side in a wiring length distribution, one of an allowable length of the set of short wiring in view of resistance characteristics determined by a current density of the sets of wiring and an allowable length of the set of long wiring in view of capacitive sharacteristics, and a combination thereof.

17. According to a photomask design method for manufacturing the semiconductor integrated circuit device of the present invention based on the photomask design method recited in above-mentioned item 2, said reference value is K times as high as an average value of the spread of nets in the wiring region, M times as large as a width of an interior of the wiring region, N% of the spread of the nets on a shorter side in a wiring length distribution, one of an allowable lenth of the set of short wiring in view of resistance charateristics determined by a curren density of the set of wiring and an allowable length of the sets of long wiring in view of capacitive characteristics, and a combination thereo.

18. According to a photomask design method for manufacturing the semiconductor integrated circuit device of the present invention based on the photomask design method recited in above-mentioned item 3, said reference value is K times as high as an average value of the spread of nets in the wiring region, M times as large as a width of an interior of the wiring region, N% of the spread of the nets on a shorter side in a wiring length distribution, one of an allowable length of the set of short wiring in view of resistance characteristics determined by a current density of the set of wiring and an allowable length of the set of long wiring in view of capacitive characteristics, and a combination thereof.

According to the above-mentioned present invention, the interval between a set of short wiring and a set of long wiring is determined in accordance with the layout rules using the Lev nson type phase shift. It is, therefore, possible to make the interval relatively narrower than an interval determined in accordance with the layout rules not using the Levenson type phase shift, and to reduce the area of the wiring region. Also, the number of sets of long wiring provided in parallel to each other is decreased, and the interval between the sets of long wiring is determined in accordance with the layout rules not using the Levenson type phase shift, and the set of short wiring are put between the sets of long wiring in many cases. Therefore, it is possible to prevent the sets of long wiring from being provided in parallel and in proximity to each other, and to suppress an increase in the parasitic capacity of the sets of long wiring to prevent an increase in delay time. Furthermore, at the time of manufacturing a phase shift mask, wiring tracks different in phase are alternately arranged in advance so as to invert each phase of adjacent patterns, and the sets of short wiring and the sets of long wiring are alternately allotted to the above-mentioned wiring tracks. Due to this, no contradictory portion occurs and no number of steps of correcting layout thereof occurs.

BEST MODE FOR CARRYING OUT THE INVENTION

Figure 1:
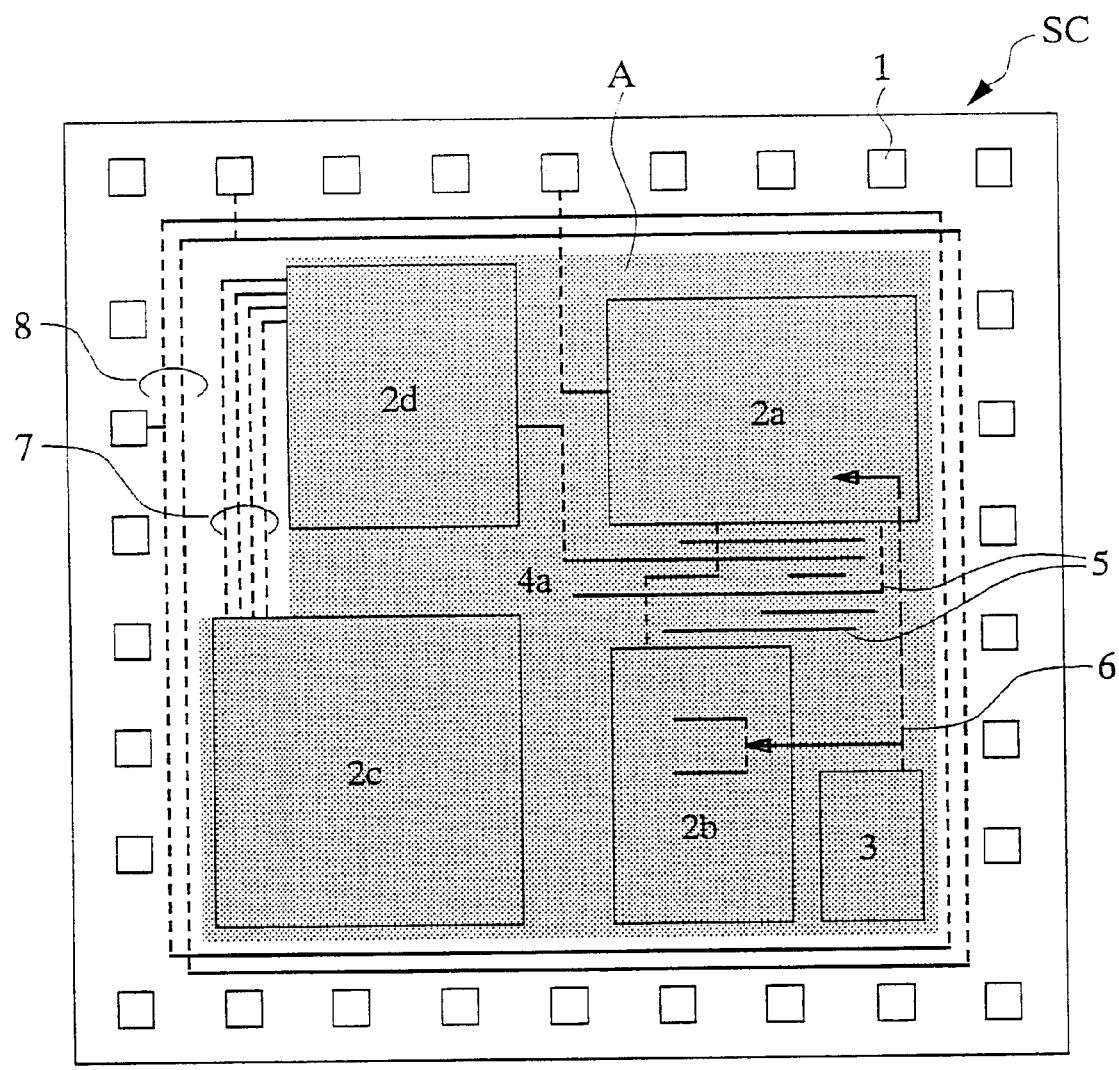
FIG. 1 is a constituent view of an entire semiconductor chip.

Embodiments for carrying out the present invention will be described hereinafter in detail on the basis of the drawings. It is noted that elements having the same functions are denoted by the same reference symbols in the entire drawings for describing the embodiments and repetitive description thereof will not be given.

Further, while well-known typical examples which appear the best mode to date will be concretely described in the following embodiments, elements constituting the embodiments in the present invention are not necessarily essential to many inventions included in the present application except a case of such the best mode.

Likewise, except for cases of reference to the number (including numeral value, quantity, range and the like) of elements, and of particularly clear statements, and of limitation of clearly specific numbers in principle, the number of elements constituting the following embodiments is not limited to the specific numbers, that is, for example, may be more or less than the specific numbers.

Furthermore, the term, "semiconductor wafer", described hereinafter implies an insulating substrate such as a monocrystal silicon substrate, an SOS (Silicon On Sapphire), an SOI (Silicon On Insulator) and a TFT (Thin Film Transistor). Needless to say, the semiconductor wafer implies not only an unprocessed wafer but also a wafer on which an insulating film and a conductive film are formed during wafer manufacturing steps.

Also, the term, "Levenson type phase shift mask", normally means a mask for making two light beams interfere with each other on a semiconductor wafer. One of the two light beams permeates opening portions, the other permeates the other opening portions between and adjacent to the opening portions, either one or the other light beam is made to be inverted in phase, and thereby the two light beams are diffracted on the semiconductor wafer. Inversion of the phase of the light beam is achieved by adding a layer called a phase shifter to the opening portion on a mask or by providing grooves in a semiconductor substrate.

Further, the term, "automatic routing", means automatic or semiautomatic processing for global routing, detailed routing and the like conducted in design of wiring patterns, and is not limited to the automatic or semiautomatic processing. The term, "ordinary wiring", means wiring which includes not only respective sets of signal wiring connected between signal terminals of blocks such as logical blocks, memory blocks, analog blocks, and the like but also the other sets of signal wiring connected between an apparatus other than the above-mentioned blocks, e.g., a clock generator and the signal terminals of the above-mentioned blocks, and which is subjected to automatic routing. In addition, the term, "special function wiring", means wiring such as bus wiring, peripheral power main wiring, and means wiring which is not subjected to automatic routing and which differs from the ordinary wiring.

Further, the term, "net", means an aggregate of signal paths connecting a plurality of terminals having the same potential.

Figure 2A:
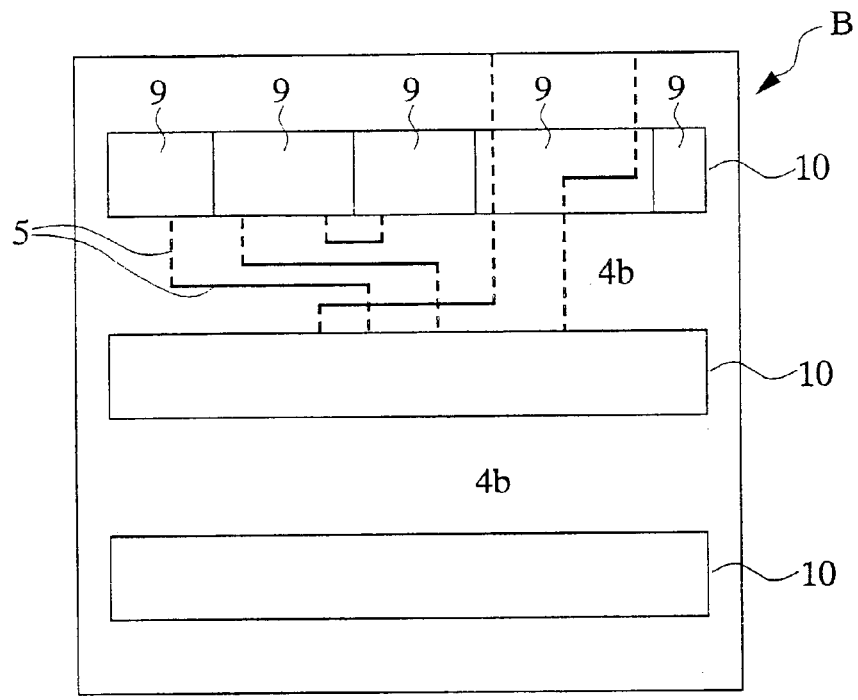
FIG. 2A is a constituent view of blocks constituting the semiconductor chip.
Figure 2B:
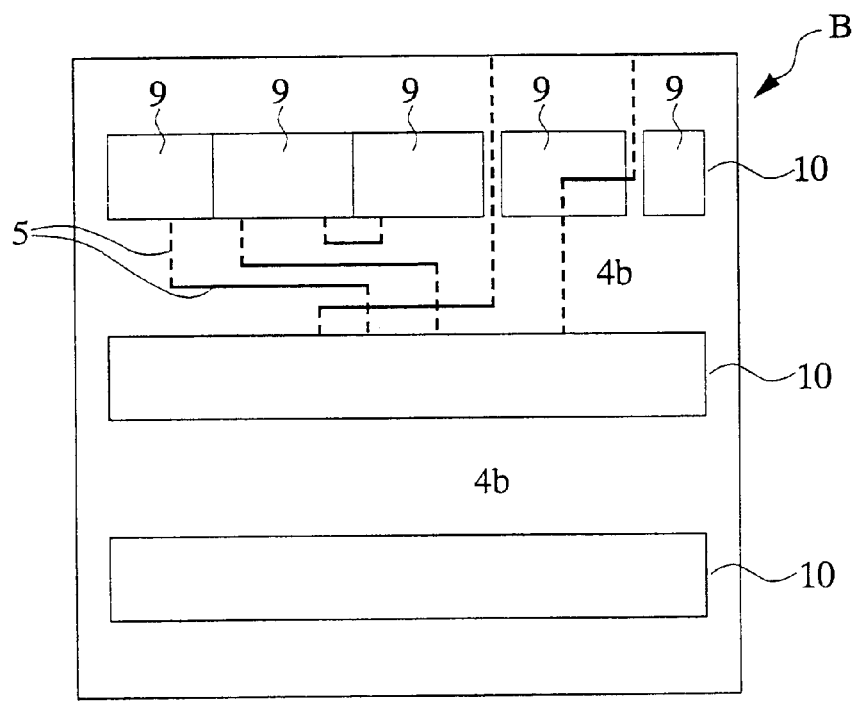
FIG. 2B is a constituent view of blocks constituting the semiconductor chip.
Figure 3:
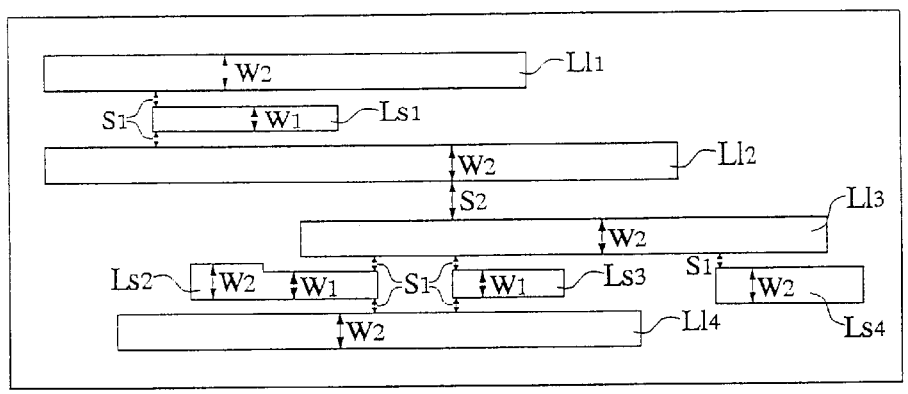
FIG. 3 is a layout view of a pattern of sets of wiring arranged in parallel to each other in lateral direction.
Figure 4:
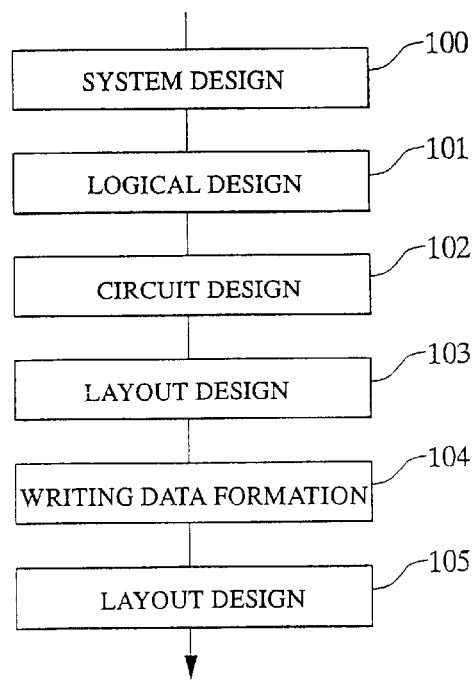
FIG. 4 is a step view showing mask pattern design procedures.
Figure 5:
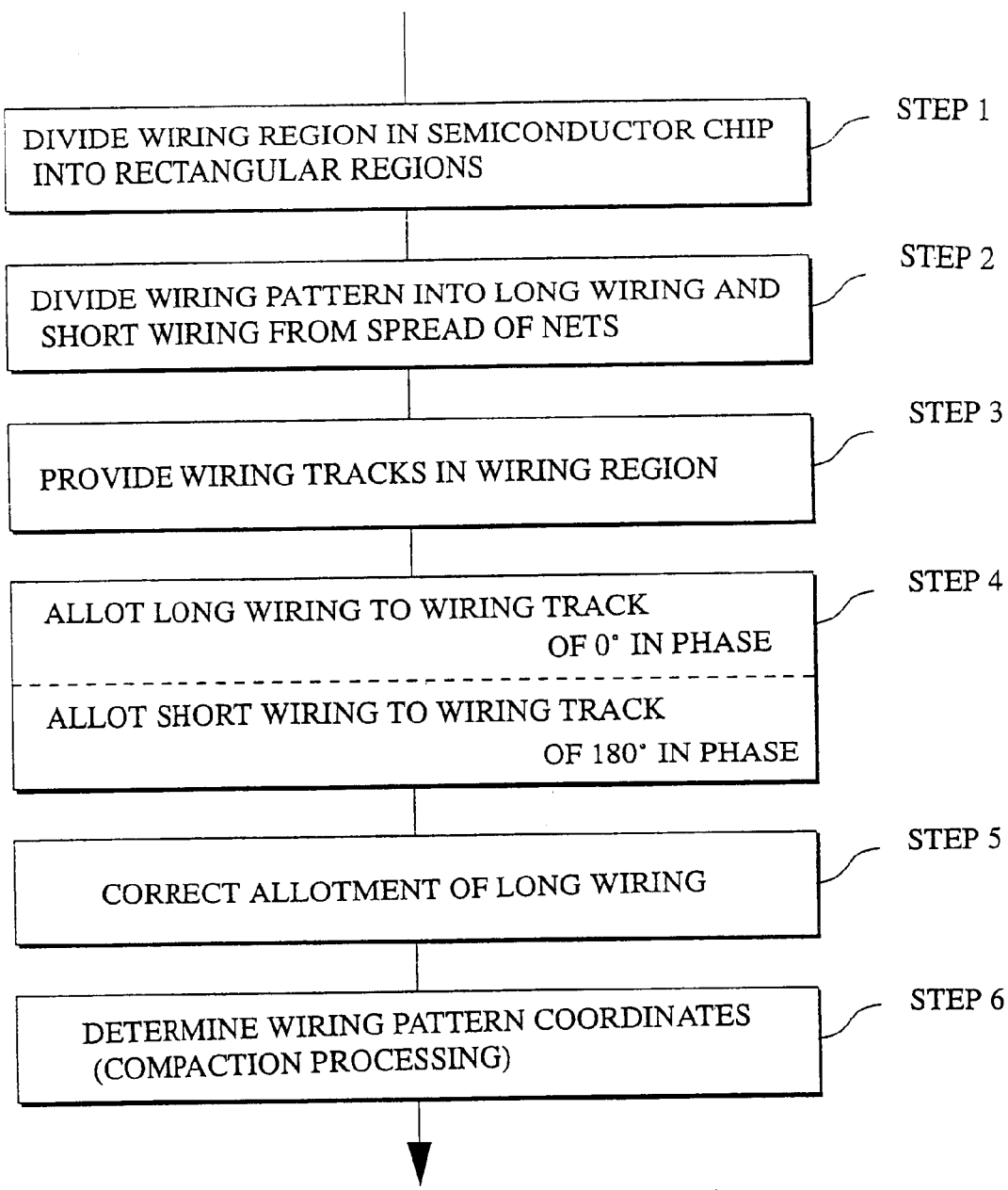
FIG. 5 is a step view showing a wiring pattern allotment processing in layout design.

In the present invention, description will be given to the placement of signal wiring in a wiring region in which ordinarywiringsubjectedtoautomaticroutingispresent. The layout of a wiring pattern in one embodiment of the present invention will be described with reference to FIGS. 1 to 13. FIG. 1 is a constituent view of an entire semiconductor chip. FIGS. 2A and 2B are constituent views of blocks constituting the semiconductor chip. FIG. 3 is a layout view of a pattern of sets of wiring arranged in parallel to each other in lateral direction. FIG. 4 is a step view showing mask pattern design procedures. FIG. 5 is a step view showing a wiring pattern allotment processing in layout design. FIGS. 6 to 11 are explanatory views showing the wiring pattern allotment processing in the layout design shown in FIG. 5 for respective processing procedures (or Steps). FIGS. 12A and 12B are explanatory views showing the reduction effects of an interval between adjacent sets of wiring and a wiring width by an exposure method using a Levenson type shift mask. FIG. 13 is an explanatory view showing one example of the constitution of a system for generating mask pattern design data.

As shown in FIG. 1, blocks 2a to 2d and a clock generator 3 are placed on the principal surface of a semiconductor chip SC surrounded by a plurality of pads 1. The blocks 2a to 2d are, for example, logical blocks, memory blocks, analog blocks and the like.

A sub-wiring region 4a is provided between the blocks to separate from the blocks 2a to 2d. In this sub-wiring region 4a, signal lines 5 connected between the blocks, and a set of clock signal wiring 6 connected between the clock generator 3 and the other block are placed. In FIG. 1, a region A in which ordinary wiring subjected to automatic routing is present is indicated by half-tone dot mesh hatching. Special function wiring, e.g., bus wiring 7 and rounding power wiring 8, which is not subjected to automatic routing, is placed around the region A in which the ordinary wiring subjected to automatic routing is present.

Among the blocks 2a to 2d stated above, the logical block consisting of a logical circuit is constituted by aligning cells 9, forming cell rows 10 and stacking the cell rows 10 up as shown in FIG. 2A. Signal terminals are provided above, below or inside the cells 9. Using sub-wiring regions 4b between the cell rows 10, the sets of signal wiring 5 are arranged. The signal wiring 5 may be placed above the cells 9 as shown in FIG. 2A or may not be placed above the cells 9 as shown in FIG. 2B.

Here, the sets of signal wiring 5 are placed in the sub-wiring region 4a between the blocks or in the sub-wiring regions 4b between the cells 9 in one block. The sets of signal wiring 5 are also placed between signal terminals of the cells 9 constituting one block and signal terminals of the cells 9 constituting the other block. Therefore, the region indicated by one-dot mesh hatching in FIG. 1 becomes the region A in which the ordinary wiring subjected to the automatic routing is present. The entire semiconductor chip may be often constituted by one block.

Next, FIG. 3 shows one example of a layout view of the signal wiring 5 placed in the region A in which the ordinary wiring subjected to the automatic routing is present. In FIG. 3, a wiring pattern of the sets of signal wiring (lateral wiring) placed parallel to the cell rows is shown.

The wiring pattern consists of the same wiring layer and is set to have sets of long wiring L1 and sets of short wring Ls by comparison with a reference value. Also, the interval $S_1$ between a set of long wiring L1 and a set of short wiring Ls is set to be narrow relatively to the interval $S_2$ between sets of long wiring L1 and L1 by making the layout rule of the long wiring L1 differ from that of the short wiring Ls.

Further, if the sets of long wiring L1 are respectively placed above and below the sets of short wiring Ls, the width $W_1$ of a set of short wiring Ls is set to be relatively narrower than the width $W_2$ of a set of long wiring L1. By separating the short wiring Ls and the long wiring L1 and making the short wiring Ls narrow enough to be resistively negligible, the area of the entire semiconductor chip can be reduced. For example, the widths $W_1$ of the respective sets of short wiring Ls, put between the sets of long wiring $L1_1$ and $L1_2$ and the sets of short wiring $Ls_2$ and $Ls_3$ put between the sets of long wiring $L1_3$ and $L1_4$ are set to be narrow relatively to the widths $W_2$ of the sets of long wiring $L1_1$ to $L1_4$. However, in case of a set of short wiring $Ls_4$ below which a set of long wiring L1 is absent, the width thereof may be set equal to the width $W_2$ of the sets of long wiring L1. In addition, in case of the short wiring $Ls_2$ below which the long wiring $L1_4$ is present but above which the sets of long wiring L1 are absent, the partial width thereof may be set equal to the width $W_2$ of the sets of long wiring.

The same thing is true for the layout of sets of signal wiring (longitudinal wiring) placed perpendicular to the cell rows, but the lateral wiring and the longitudinal wiring consist of different layers. However, a wiring layer mainly used for the lateral wiring may be used for the longitudinal wiring, and a wiring layer mainly used for the longitudinal wiring may be used for the lateral wiring.

Next, description will be given to the design of the wiring layout shown in FIG. 3. As shown in FIG. 4, a mask pattern is formed through system design (Step 100), logical design (step 101), circuit design (Step 102) and layout design (Step 103) which is the final design step. Based on design data on this mask pattern, writing data is generated (in Step 104) and a photomask is formed (in Step 105).

In the above-mentioned layout design, the shape of the mask pattern is designed and the coordinates of respective circuit elements or sets of wiring are determined. Mask pattern graphic forms used in the layout design are expressed as an aggregate of polygons or rectangles, and the placement and layers of the respective graphic forms are managed as data of a calculator. Here, layers mean graphic forms belonging to photomasks necessary for respective exposure steps.

In the layout design of the wiring pattern according to the present invention, schematic wiring paths in the region A in which ordinal wiring subjected to automatic routing are present on the semiconductor chip, is determined first in global routing processing steps (steps 1 and 2) as shown in FIG. 5. Next, the detailed layout of lateral sets of wiring and longitudinal wiring is determined in detailed routing processing steps (Steps 3 to 6). The detailed routing processing steps as described above have a case where a processing is executed collectively to the entire semiconductor chip and a case where a processing is executed for each block. In the latter processing, after repeating of the detailed routing processing steps for each block, the detailed routing processing steps are executed between the blocks and the wiring pattern of the entire semiconductor chip are designed.

Next, by using the step view shown in FIG. 5, description will be given to procedures for a wiring pattern allotment processing and a compaction processing in the layout design.

[Step 1] The region A in which ordinary wiring subjected to automatic routing on the semiconductor chip is present is divided into rectangular regions. A rectangular region corresponds to a unit shape through which the schematic wiring path passes. If detailed wiring pattern placement is conducted for each block, the rectangular region is set so that a frame of the block coincides with a frame of the rectangular region.

[Step 2] The spread of nets in the semiconductor chip is compared with a reference value a, and respective wiring patterns extending in lateral direction and in longitudinal direction are individually divided into the sets of long wiring and the sets of short wiring. A schematic path is determined by using the rectangular regions so as to avoid increasing redundant wiring and to averagely distribute the long wiring.

To set the reference value a, one of the following methods is adopted. The first method is to set a value K times as high as the average value of the spread of the net in the wiring region, as the reference value $\alpha$. In this method, the reference value $\alpha$ is set according to the spreading degree of the nets. The second method is to set a value M times as wide as the coordinate width of the wiring region, as the reference value $\alpha$. In this method, the reference value $\alpha$ is set according to the shape of the wiring region. The third method is to set N% of the spread of the nets from a shorter side in a wiring length distribution, as the reference value $\alpha$. In this method, the wiring can be divided into sets of long wiring and sets of short wiring at a certain ratio according to the wiring length distribution. The fourth method is to set the length of a set of short wiring allowable in view of the resistance characteristics determined by the current density of the set of wiring, as the reference value $\alpha$. The fifth method is to set the length of a set of long wiring allowable in view of the capacitive characteristics, as the reference value $\alpha$. Alternatively, the reference value a may be determined by combining a plurality of methods among the above-mentioned five methods.

[Step 3] In the region A in which ordinary wiring subjected to automatic routing is present, wiring tracks are provided in both lateral and longitudinal directions. The wiring tracks mean virtual grids for allocating the wiring pattern. In the region A in which ordinary wiring subjected to automatic routing is present, wiring tracks having a phase of 0° and wiring tracks having a phase of 180° are alternately placed to be adjacent to one another.

[Step 4] By using a line search wiring method, a channel wiring method, a labyrinth wiring method or the like, sets of long wiring are allotted to the wiring tracks having a phase of 0° and sets of short wiring are allotted to the wiring tracks having a phase of 180°, respectively. At the time of allocating the sets of short wiring, the wiring tracks above and below which the sets of long wiring are present are preferentially used. If the total number of wiring tracks is increased by allocating the sets of short wiring to the wiring tracks different from those which the sets of long wiring are allocated, the sets of short wiring are allotted to the same wiring tracks.

If at leas one of the long wiring and the short wiring is allocated, the region to be processed in Step 1 is extended and the coordinates of both relevant cells and blocks are shifted in accordance with the extended width and Step 4 is repeated.

If a plurality of wiring patterns are allotted to one wiring track, the wiring patterns are allotted such that the adjacent wiring patterns are away from each other by a dimension equal to or more than a minimum processed dimension that can be processed without using a phase shifter.

[Step 5] If the number of sets of long wiring is present excessively in comparison with the number of sets of short wiring, all the sets of long wiring allotted to one wiring track for sets of long wiring can be divided into sets of short wiring, and such portions that sets of long wiring are present above and below the sets of short wiring increase, then the sets of long wiring are divided into plural sets of short wiring and the plural sets of short wiring divided are allotted again to the wiring tracks. It is noted, however, that a critical net for clock signals or the like is the sets of long wiring, the net is not processed in Step 5.

[Step 6] Wiring pattern coordinates extending in lateral direction and wiring pattern coordinates extending in longitudinal direction are determined in accordance with layout rules (compaction processing is carried out).

First, the wiring pattern coordinates extending in the lateral direction are determined. In view of the characteristics of both wiring resistance and capacitance, the layout rules of the short wiring are set different from the layout rules of the long wiring, the width of a set of short wiring is set narrow relatively to the width of a set of long wiring and then the coordinates of both wiring patterns are determined. For example, the width of a set of long wiring is set to be twice as large as a minimum processed dimension U which can be processed without using a phase shifter, and the width of a set of long wiring is set to be equal to a minimum processed dimension which can be processed using the phase shifter. It is noted, however, if the sets of short wiring are allocated such that sets of long wiring are absent on the wiring tracks thereabove or therebelow, the width of a set of short wiring may be equal to the width of a set of long wiring. Also, if the sets of short wiring are allocated having such a portion that sets of long wiring are absent on the wiring tracks thereabove or therebelow, the width of a set of short wiring may be equal to the width of a set of long wiring.

In addition, in the compaction processing, intervals between the sets of short wiring and the sets of long wiring are set to be narrow relatively to intervals between the sets of long wiring. For example, the interval between the wiring track on which the set of long wiring are placed and the wiring track on which the sets of short wiring are placed is set at the minimum processed dimension at the time of using a phase shifter. Further, if no short wiring is present on the wiring track put between the adjacent wiring tracks on which the sets of long wiring are present, the interval between the sets of long wiring is set to be, for example, twice as large as the minimum processed dimension U which can be processed without using the phase shifter.

The above-mentioned compaction processing may be carried out from a lower wiring track in ascending order, from an upper wiring track in descending order, or sequentially from a central wiring track.

Next, the wiring pattern coordinates extending in the longitudinal direction are determined. The wiring pattern coordinates extending in the longitudinal direction are determined in the same manner as the procedures for determining the wiring pattern coordinates extending in the lateral direction as mentioned above. This compaction processing may be carried out from the left wiring track in a right direction, from the right wiring track in a left direction, or sequentially from the central track. After the coordinate x of the longitudinal wiring pattern is determined, the coordinate x of the lateral wiring pattern connected to the longitudinal wiring pattern is determined.

It is noted that some of the above-mentioned processing of the blocks can be executed independently but are not limited in order of all the processings.

Next, a wiring pattern allotment processing and a compaction processing will be described using concrete wiring patterns. As an example, description will be given to the allotment processing for the wiring patterns placed in one block B.

Figure 6:
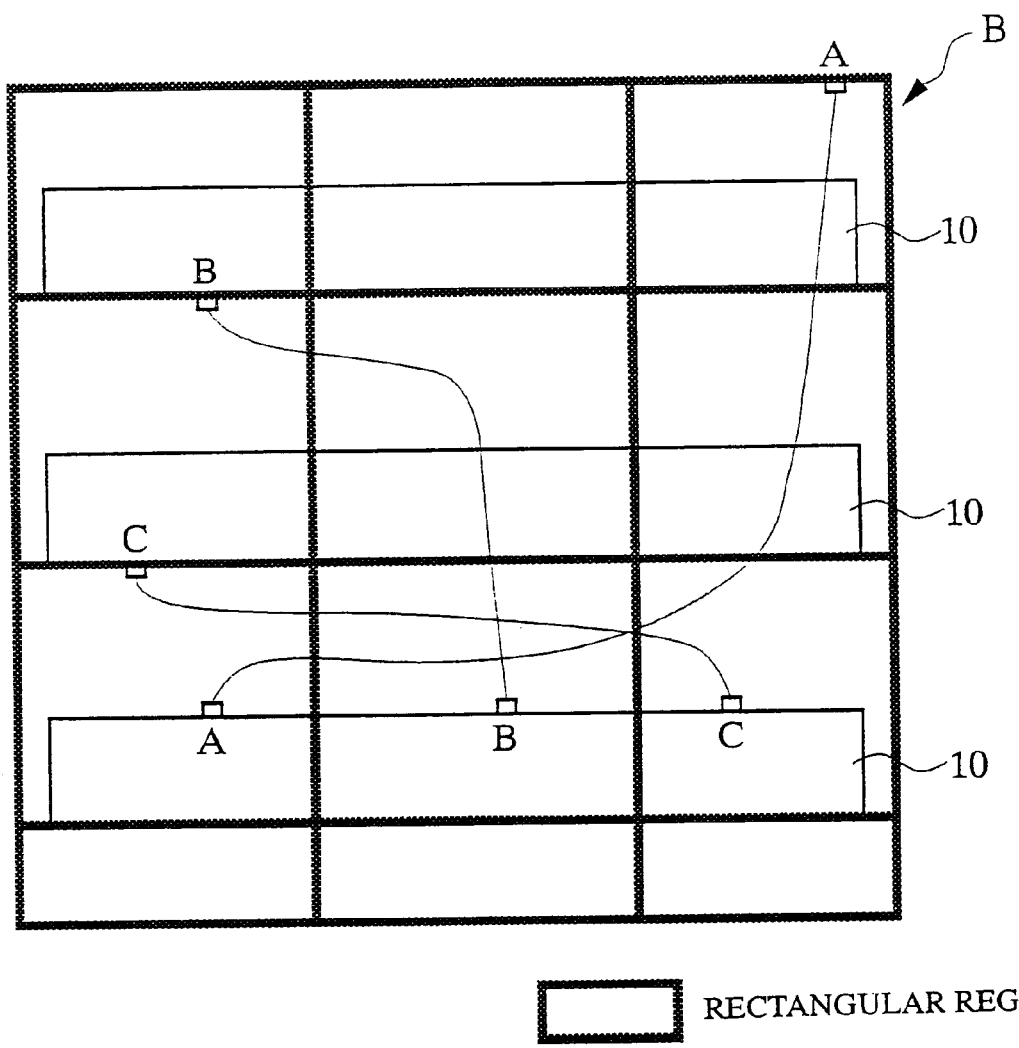
FIG. 6 is an explanatory view showing the wiring pattern allotment processing (Steps 1 and 2) in the layout design shown in FIG. 5.

First, in Step 1, one block B is divided into rectangular regions. FIG. 6 shows the result of dividing one block B into twelve rectangular regions.

Next, in Step 2, after terminals of a net are registered, the respective nets are divided into sets of short wiring and sets of long wiring in accordance with the comparison of the lengths of the respective nets with the reference value a. Each spread of both the lateral and longitudinal components of the respective nets is also obtained. Then, the schematic paths of the wiring patterns are allotted so that the sets of long wiring are averagely distributed. Information on the registered terminals of the net contain, for example, coordinates on the wiring grid located in a left side, each side of coordinates on the wiring grid located in the left side, coordinates on the wiring grid located in a right side and each side of the coordinates on the wiring grid located in the right side. FIG. 6 shows the result of allocating the schematic paths of the wiring pattern.

Figure 7:
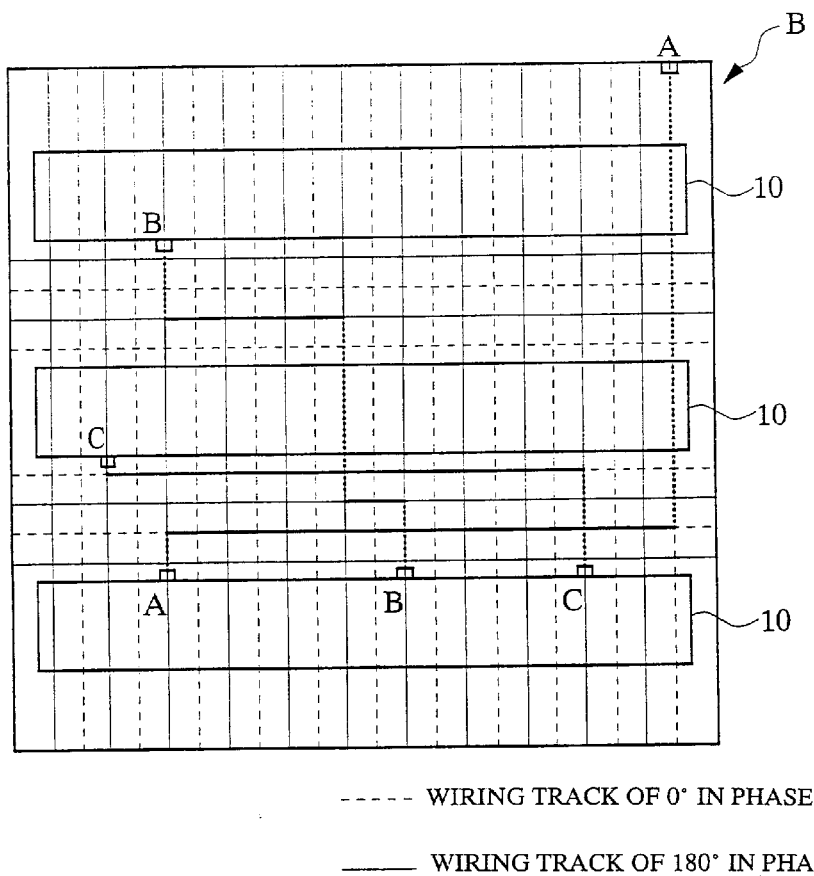
FIG. 7 is an explanatory view showing the wiring pattern allotment processing (Steps 3 and 4) in the layout design shown in FIG. 5.

Next, in Step 3, wiring tracks having a phase of 0° and wiring tracks having a phase of 180° are alternately provided in lateral and longitudinal directions, respectively. FIG. 7 is a view showing that the wiring tracks having a phase of 0° and the wiring tracks having a phase of 180° are provided in the block B.

Next, in Step 4, by using, for example, a line search wiring method, the respective sets of long wiring determined in Step 2 are allotted to the wiring tracks having a phase of 0°. Next, the sets of short wiring are allotted to the wiring tracks having a phase of 180°. FIG. 7 shows the result of allocating the sets of long wiring and the sets of short wiring to the respective wiring tracks.

Figure 8:
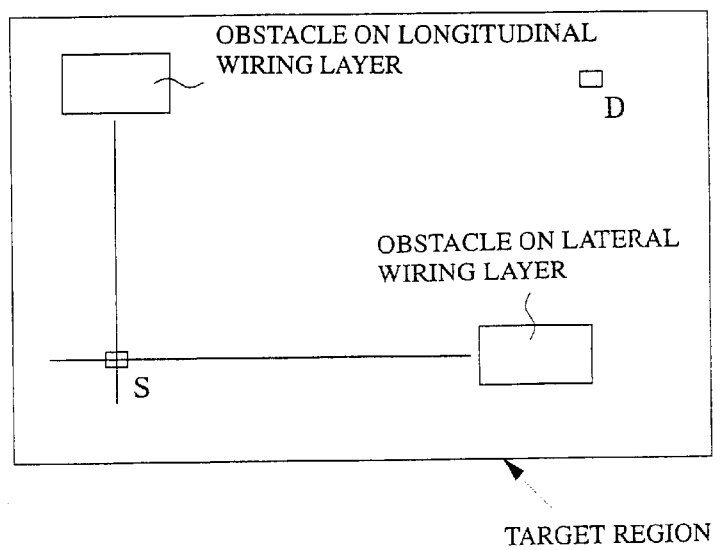
FIG. 8 is an explanatory view for a line search algorithm.

Next, procedures for the line search wiring method will be described with reference to FIG. 8. In case of line search wiring, a start point S is connected to a target point by D using one longitudinal wiring layer and one lateral wiring layer.

First, as the first procedure, segments as a candidate of a wiring pattern are generated from the start point S in the longitudinal direction and the lateral direction, respectively. Generation of the segments ranges up to the end of a target region, or to an obstacle of the above-mentioned wiring layer, e.g., the wiring pattern of the existing other net, a pattern in a cell, or the like.

Next, as the second procedure, that the segments arrive at the target point D means to have searched one wiring path. A segment group of segments coupling the start point S and the target point D along the shortest paths are partially defined as actual wiring patterns, and a processing for one net is finished. It is noted that a contact coupling the two wiring layers is generated at an intersection between the longitudinal wiring and the lateral wiring of a newly generated wiring pattern. Further, all the generated segments are deleted for a processing for the next net.

If no segment arrives at the target point D, a segment orthogonal to the finally generated segment is generated at such a point that the orthogonal segment can be closest to the point D. Here, it is assumed that a new segment is generated at such a position that there is no point of intersecting between another segment and a finally generated segment. If a new segment can be generated through the processing according to the third procedure, the second procedure is executed. If a new segment cannot be generated, then the above-mentioned net has no set of wiring, or the third procedure is again executed after the target region is expanded.

Figure 9A:
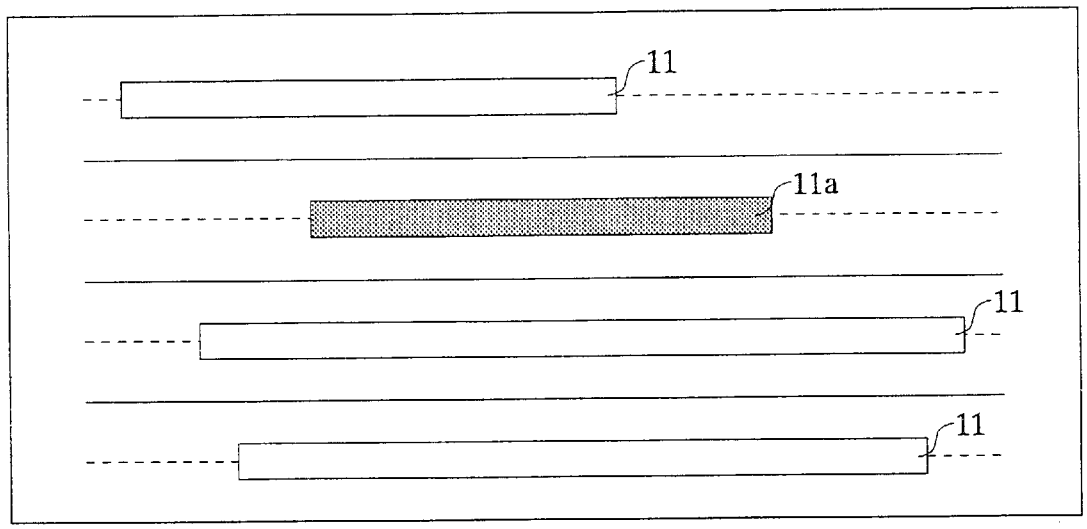
FIG. 9A is an explanatory view showing a wiring pattern allotment correction processing (Step 5) in the layout design shown in FIG. 5.
Figure 9B:
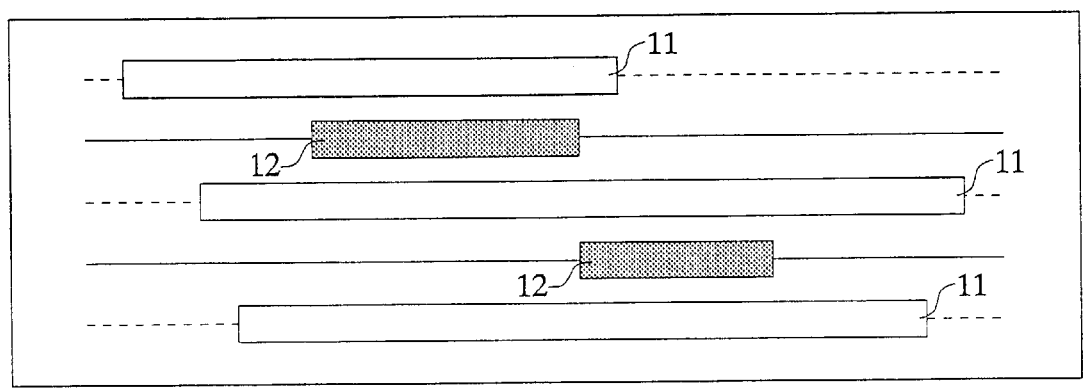
FIG. 9B is an explanatory view showing a wiring pattern allotment correction processing (Step 5) in the layout design shown in FIG. 5.

Next, in Step 5, a wiring pattern allotment correction processing is carried out. FIG. 9 shows one example of dividing a set of long wiring into plural sets of short wiring and again allocating these sets of short wiring to respective wiring tracks having a phase of 180°, respectively. As shown in FIG. 9A, if four sets of long wiring 11 or more are present on respective wiring tracks having a phase of 0° and no set of short wiring is present on a wiring track having a phase of 180° between the adjacent wiring tracks having a phase of 0°, then longer the respective sets of longer wiring on the wiring pattern are selected in long order and then the following processing is executed. First, the selected set of long wiring 11a is divided into sets of short wiring. At this time, the division thereof is carried out if the selected set of long wiring can be such that the sets of long wiring 11 exist above and below the newly generated sets of short wiring 12 by division. Next, as shown in FIG. 9B, the newly generated sets of short wiring 12 are allotted again to the wiring tracks having a phase of 180°, respectively. It is noted that the division processing is actually executed only when all the sets of long wiring on one wiring track therefor are dividable.

Figure 10:
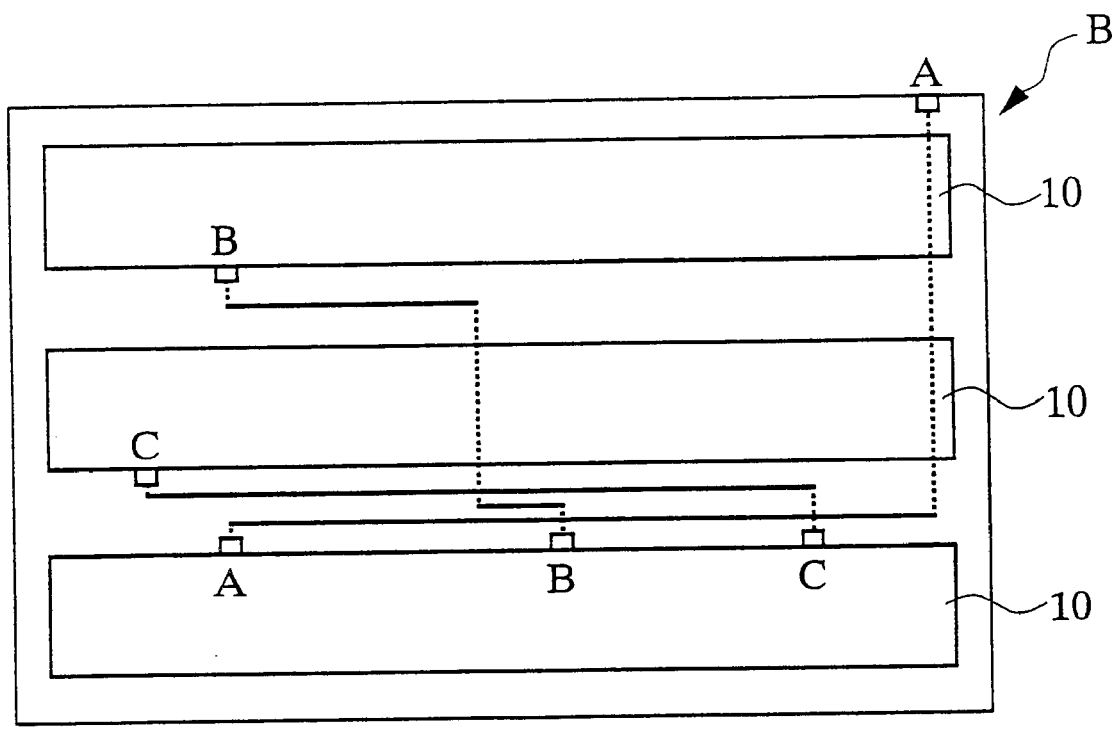
FIG. 10 is an explanatory view showing the wiring pattern allotment processing (Step 6) in the layout design shown in FIG. 5.

Next, in Step 6, a compaction processing is carried out, and mask pattern design data, which is final coordinates, is generated. FIG. 10 shows a placement view of a wiring pattern in the block B which has been subjected to the compaction processing.

Next, by way of an example, a processing method will be described in detail in which a compaction processing is executed in a wiring pattern for which an allotment processing shown in FIG. 11 has been completed, and the wiring pattern layout view shown in FIG. 3 is generated.

The width $W_2$ of each set of long wiring 11 placed on the wiring tracks having a phase of 0° is set to be, for example, twice as large as the minimum processed dimension U which can be processed without using a phase shifter. If the sets of long wiring 11 are placed on the wiring tracks having a phase of 0°, and the sets of short wiring 12 are placed on the wiring tracks having a phase of 180° put between the sets of long wiring 11, then the width $W_1$ of each set of short wiring 12 is set to be relatively narrow to the width $W_2$ of each of the sets of long wiring 11. The width $W_1$ of each of the sets of short wiring 12 is set to be, for example, 1.5 to 2.0 times as large as the minimum processed dimension U which can be processed without using the phase shifter. It is noted, however, that if the long wiring 11 is not placed on one of the adjacent wiring tracks having a phase of 0°, then the width of each set of short wiring 12 placed on the wiring track having a phase of 180° is set to be the same as the width $W_2$ of each set of long wiring 11. Also, if the sets of long wiring 11 are not partially placed on the adjacent wiring tracks having a phase of 0°, the width of a set of short wiring 12 corresponding to a portion of a set of long wiring 11 not placed is set to be the same as the width $W_2$ of the long wiring 11.

Further, if the sets of long wiring 11 are placed on the wiring tracks having a phase of 0° and the sets of short wiring 12 are not placed on the wiring tracks having a phase of 180° to be put between the sets of long wiring 11, then the interval $S_2$ between the adjacent sets of long wiring 11 is set to be twice as large as the minimum processed dimension U which can be processed without using the phase shifter. If the sets of long wiring 11 are placed on the wiring tracks having a phase of 0° and the sets of short wiring 12 are placed on the wiring track having a phase of 0° to be put between the sets of long wiring 11, then the interval $S_1$ between the sets of long wiring 11 and the sets of short wiring 12 is set to be relatively narrow to the interval $S_2$ between the adjacent sets of long wiring 11. The interval $S_1$ between the sets of long wiring 11 and the sets of short wiring 12 is set at, for example, a minimum processed dimension which can be processed using the phase shifter and 0.75 times as large as the minimum processed dimension U which can be processed without using the phase shifter.

By the above-mentioned compaction processing, the wiring pattern layout shown in FIG. 3 is obtained, coordinates are determined, and mask pattern design data is generated.

Next, a method of reducing a minimum processed dimension using the Levenson type phase shifter will be described with reference to FIG. 12.

Figure 12A:
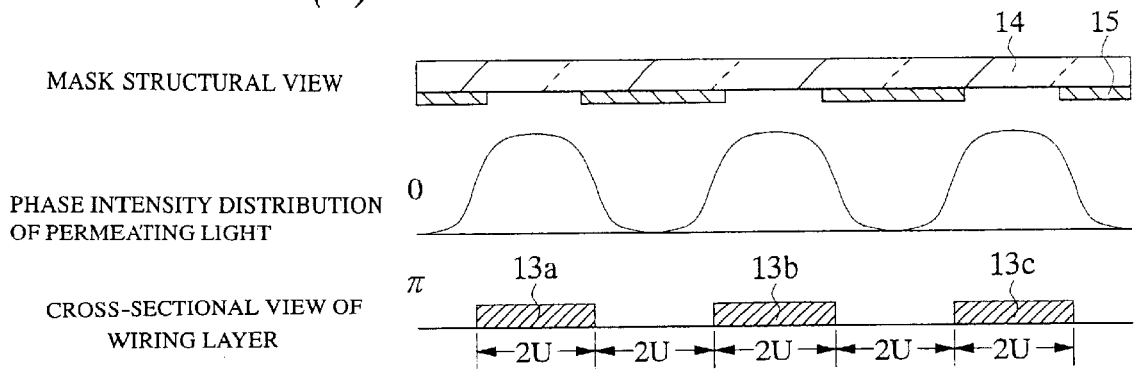
FIG. 12A is an explanatory view showing the reduction effects of an interval between adjacent sets of wiring and a wiring width by an exposure method using a Levenson type shift mask.
Figure 12B:
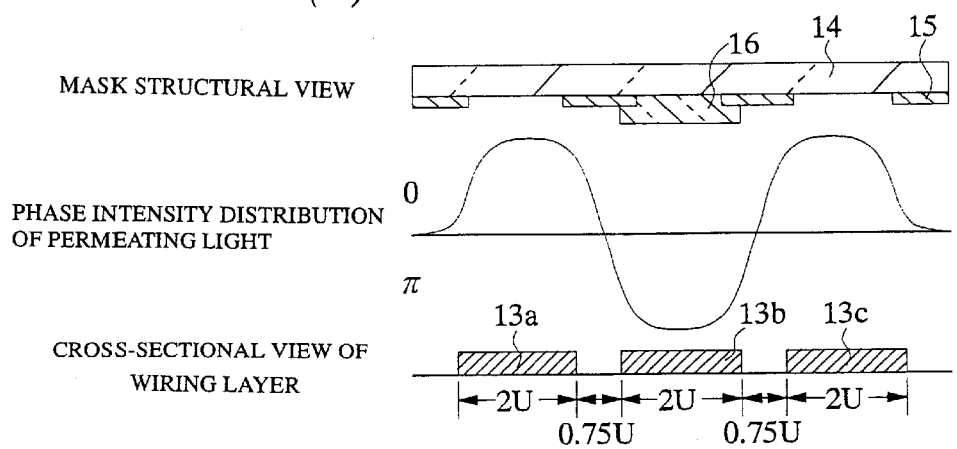
FIG. 12B is an explanatory view showing the reduction effects of an interval between adjacent sets of wiring and a wiring width by an exposure method using a Levenson type shift mask.
Figure 12C:
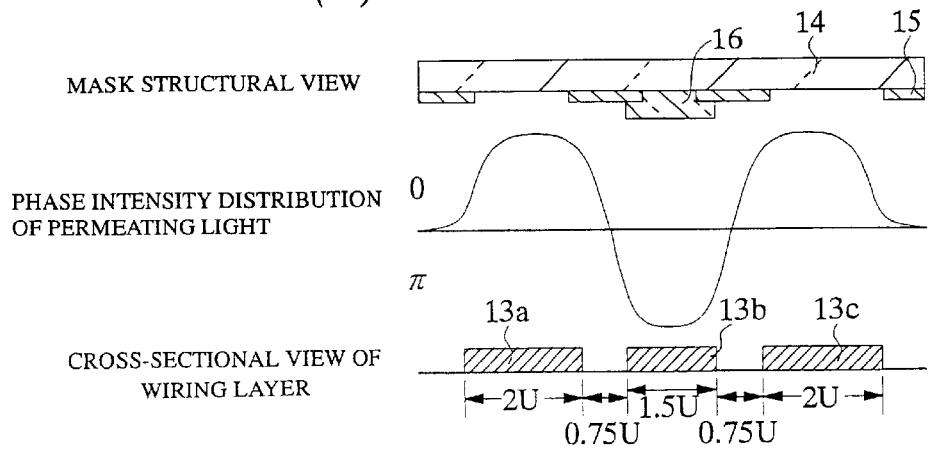
FIG. 12C is an explanatory view showing the reduction effects of an interval between adjacent sets of wiring and a wiring width by an exposure method using a Levenson type shift mask.
Figure 13:
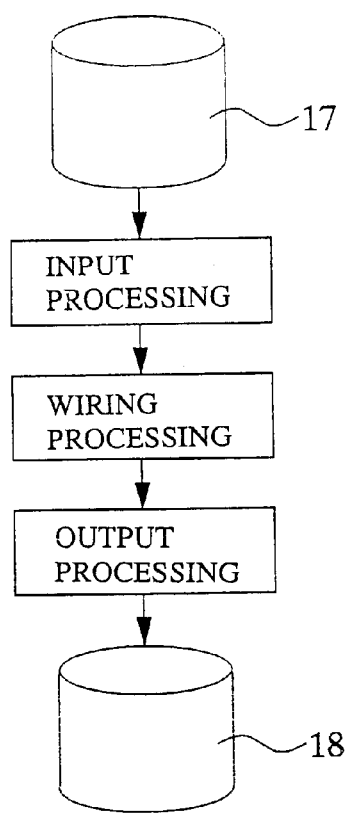
FIG. 13 is an explanatory view showing one example of the constitution of a system for generating mask pattern design data.

FIG. 12A shows the first method of forming three adjacent sets of wiring without using the phase shifter, FIG. 12B shows the second method of forming three adjacent sets of wiring having the same width by using the phase shifter, and FIG. 12C shows the third method of forming three adjacent sets of wiring having different width from one another by using the phase shifter. In FIG. 12, reference symbols 13a to 3c denote respective sets of wiring, 14 denotes a glass substrate constituting a phase shift mask, 15 denotes a light shielding section, 16 denotes a phase shifter. An interval between the adjacent sets of wiring is determined by a distance at which the intensities created after interference with adjacent exposure light beams do not exceed a certain reference value. The width of each set of wiring is determined by a width at which the intensities of an exposure light beam exceeds a certain reference value and by the density of a current flowing in the set of wiring.

While both the interval between the adjacent sets of wiring formed without using the phase shifter and the width of each set of wiring are twice as large as the minimum processed dimension U (a first method), the interval between the adjacent sets of wiring can be narrowed to 0.75 times as large as the minimum processed dimension U by using the phase shifter (a second method). In this case, however, since this narrow wiring interval (0.75U) causes an increase in coupling capacity, the interval cannot be applied between the sets of long wiring adjacent to each other but applied between the sets of long wiring and the sets of short wiring adjacent to the set long wiring. The two sets of wiring 13a and 13b shown in FIG. 12B are, therefore, two sets of long wiring and the set of wiring 13b is one set of short wiring.

Further, by using the phase shifter, the wiring interval is narrowed and, at the same time, sets of wiring different in width are formed (a third method). In FIG. 12C, the two sets of wiring 13a and 13c are two sets of long wiring and the sets of wiring 13b is one set of short wiring. The width of the set of short wiring 13b is set at 1.5 to 2 times as large as the above-mentioned minimum processed dimension U. Since wiring resistance increases by reducing the width of the set of wiring, wiring width is set to fall within a range in which resistance increase is allowable.

According to the first method, the interval between the centers of the sets of wiring 13a and 13c arranged outside is eight times as large as the minimum processed dimension U. But, according to the second method, this distance is reduced to 5.5 times as large as the minimum processed dimension U. Furthermore, by using the third method, the above distance is reduced to five times as large as the minimum processed dimension U.

Figure 11:
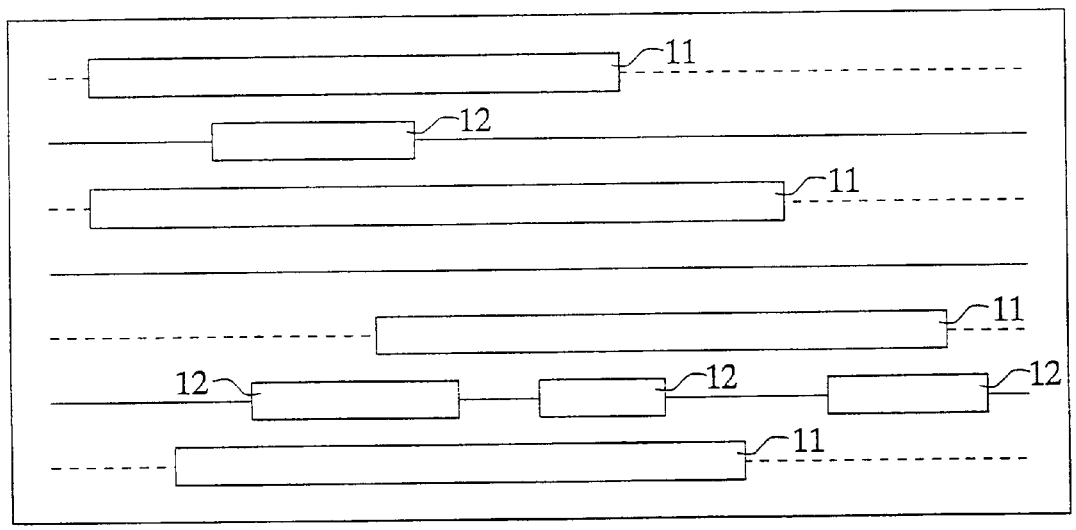
FIG. 11 is an explanatory view showing the wiring pattern allotment processing (Step 6) in the layout design shown in FIG. 5.

It is noted that if a compaction processing is conducted to a wiring pattern in which wiring allotment shown in FIG. 11 has been completed according to layout rules (the width of each set of wiring is 2U and the interval between adjacent sets of wiring is 2U) which are set on the basis of the first method, the interval between the centers of a lowermost set of wiring and an uppermost set of wiring is required to be 20 times as large as the minimum processed dimension U.

However, if the compaction processing is conducted to a wiring pattern in which the wiring allotment shown in FIG. 11 has been completed according to layout rules (the width of each set of long wiring is 2U, the width of each set of short wiring is 1.5U, the interval between adjacent sets of long wiring is 2U and the interval between a set of long wiring and a set of short wiring adjacent to the set of long wiring is 0.75U) which are set on the basis of the third method, the wiring pattern layout shown in FIG. 3 is obtained and the distance between the centers of the lowermost set of wiring and the uppermost set of wiring becomes 14 times as large as the minimum processed dimension U.

The above-mentioned wiring pattern allotment and compaction processings can be carried out by executing a software in which their execution contents are described by a computer such as a workstation.

FIG. 13 is a view showing one example of the constitution of a system for generating mask pattern design data to carry out the present invention. By designating a file in an external medium 17 which stores information, such as a net list, cell information, placement information and layout rules, from the keyboard of a workstation, the information is inputted into the workstation for carrying out a wiring pattern allotment processing (or an input processing is carried out). Next, by designating a file in the external medium which outputs information, such as placement information and wiring pattern information, from the keyboard of the workstation after the global routing processing and detailed routing processing described above (routing processings) are executed by the computer of the workstation, the above-mentioned information is outputted to the file in an external medium 18 (or an output processing is carried out).

Figure 14:
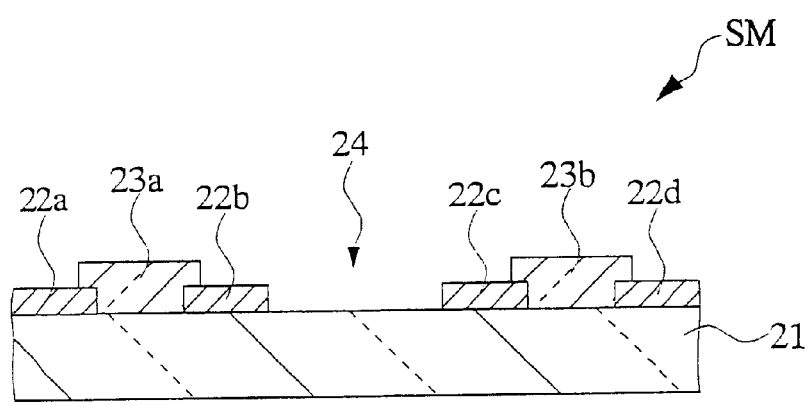
FIG. 14 is a cross-sectional view of the important parts of a phase shift mask.

Next, the phase shift mask in this mode for carrying out the invention manufactured by using the above-mentioned mask pattern design data will be described by referring to an example. FIG. 14 shows a cross-sectional view of the important parts of a phase shift mask SM. In FIG. 14, reference symbol 21 denotes a mask substrate made of synthetic quartz glass or the like, 22a to 22d denote light shielding films made of chromium (Cr) or the like, 23a and 23b are phase shifters, and 24 denotes a mask substrate exposed section or a non-shift light permeation section. It is noted that the substrate exposed section does not necessarily mean that the quartz glass substrate itself is exposed. It is also noted that the mask substrate itself may consist of a quartz glass substrate serving as a substrate main body, and a thin transparent film formed on the surface of the quartz glass substrate.

Each of the phase shifters 23a and 23b is designated by thickness of a transparent material (or thickness on the central portion of each shifter opening) determined by the refractive index of the transparent material and the wavelength of permeating light. And, the phase shifters 23a and 23b are transparent thin films made of SOG (Spin On Glass), indium oxide (InOx) or the like.

Figure 15:
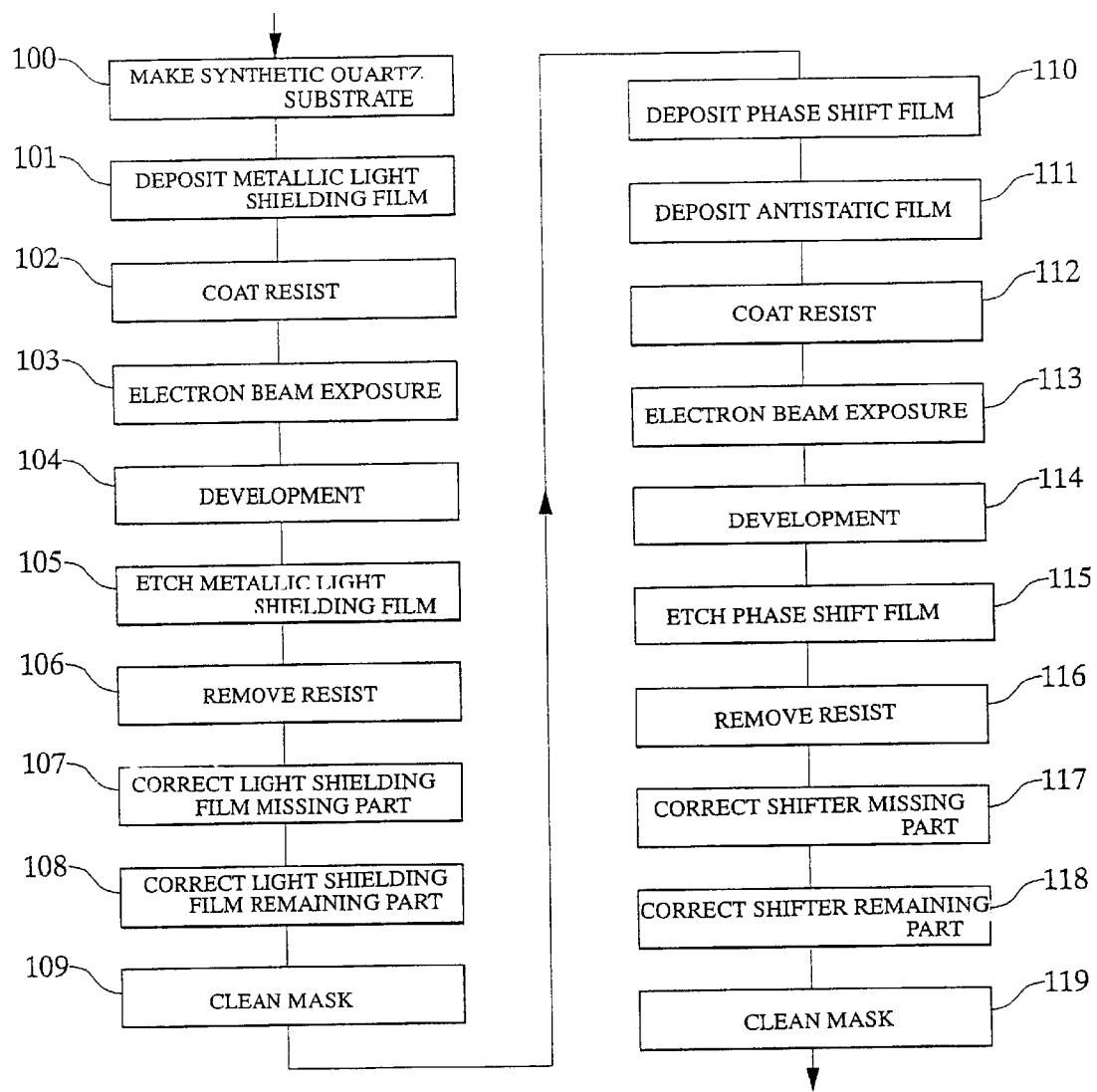
FIG. 15 is a step view for describing the manufacturing steps of the phase shift mask shown in FIG. 14.

Next, a method of manufacturing the above-mentioned phase shift mask SM will be described in accordance with Steps 100 to 119 shown in FIG. 15.

First, the surface of the synthetic quartz glass substrate is polished and cleaned to make the mask substrate 21 shown in FIG. 14 (in Step 100). Then, a light shielding film made of chromium (Cr) of, for example, about 0.05 to 0.3 $\mu$m in thickness is deposited on the entire main surface of the mask substrate 21 by a sputtering method or the like (in Step 101).

Next, after coating a sensitive electron resist film having a film thickness of, for example, 0.1 to 0.8 $\mu$m, onto the entire surface of each light shielding film by a spin coating method or the like (in Step 102), the resist film is exposed by a direct writing method by means of, for example, an electron beam exposure system and a desired pattern is transferred onto the sensitive electron resist film on each light shielding film (in Step 103). Here, among the above-mentioned mask pattern design data being input into the electron beam exposure system, data on the light shielding films is employed.

Thereafter, if the above sensitive electron resist film is a positive type, the exposed part is removed by a predetermined developer (in Step 104). Using the sensitive electron resist film left as an etching mask, each of the light shielding films is etched by a wet etching method or the like and a pattern of a predetermined shape is formed on the mask substrate 21 (in Step 105).

On the other hand, if the above sensitive electron resist film is a negative type, the unexposed part is removed by a predetermined developer (in Step 104). Using the sensitive electron resist film left as an etching mask, each of the light shielding films is etched by a wet etching method or the like and a pattern of a predetermined shape is formed on the mask substrate 21 (in Step 105).

Next, after execution of Step 106 of removing the resist film, Step 107 of correcting the light shielding film missing part, Step 108 of correcting the light shielding film remaining part, and Step 109 of cleaning the mask, a phase shift film, which is made of, for example, SOG, and which shifts the phase of the permeating light onto the mask substrate, is deposited by the spin coating method or the like (in Step 110).

Here, after coated on the mask substrate 21, the SOG film is baked at high temperature. At this time, in order to invert the phase of light, the thickness d of the phase shift film is set to satisfy the relationship of d=λ/2(n−1) where the wavelength of the permeating light is λ and the refractive index of the transparent film is n.

For example, if the wavelength λ of light used for exposure is 0.248 $\mu$m (far ultraviolet radiation or ultraviolet radiation) and the refractive index n of the phase shift film is, for example, 1.5, then the thickness of the phase shift film may be set at about 0.25 $\mu$m.

Next, after an antistatic film made of aluminum (Al) having a thickness of, for example, 0.05 μm is deposited on the phase shift film by the sputtering method or the like (in Step 111), a sensitive electron resist film for patterning the phase shift film is coated on the antistatic film (in Step 112).

Thereafter, as in the case of the above, the resist film is exposed by the direct writing method or the like by means of the electron beam exposure system, and a desired shift pattern is thereby transferred onto the sensitive electron resist film (in Step 113). Here, among the above-mentioned mask pattern design data being input into the electron beam exposure system, phase shift data is employed.

Then, after executing Step 114 of development, Step 115 of etching the phase shift film in using the resist film formed by a development treatment as an etching mask, Step 116 of removing the resist film, Step 117 of correcting a shifter missing part, Step 118 of correcting a shifter remaining part, and Step 119 of cleaning a mask, the phase shift mask SM is manufactured.

Next, an exposure technique employing the phase shift mask SM manufactured by the above-mentioned method will be described.

Figure 16:
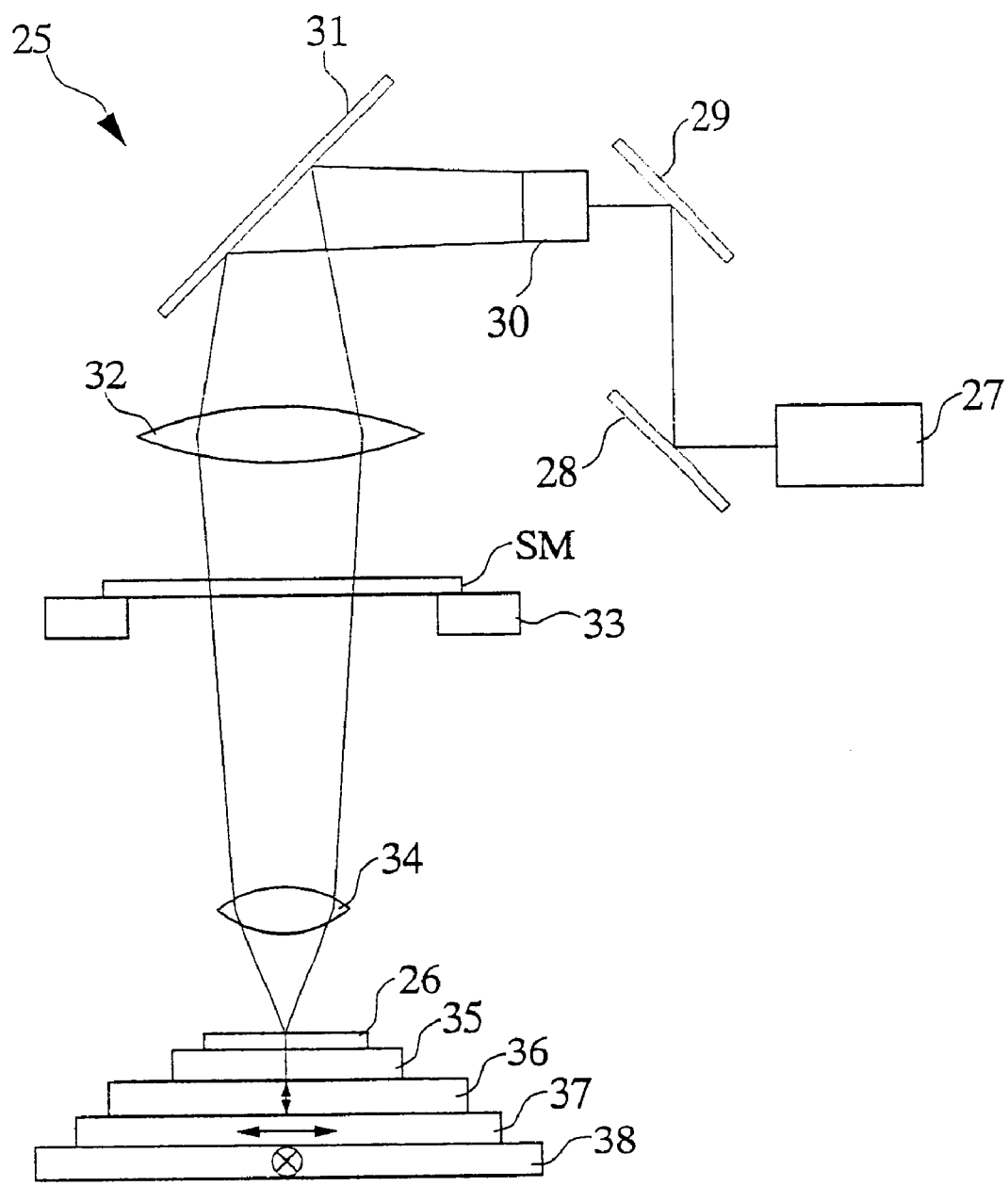
FIG. 16 is an explanatory view for a reduction projection exposure system using the phase shift mask.

First, FIG. 16 shows one example of a reduction projection exposure system (stepper) 25 used in the exposure step of the present embodiment and having a reduction ratio of 1:4 or 1:5. It is noted that a step-and-scan method in which scanning by using slit-shaped light is combined may be used.

In FIG. 16, reference symbol 26 denotes a semiconductor wafer which is made of, for example, silicon (Si) monocrystal or the like has 5 to 8 inches in size, 27 denotes a KrF excimer laser (monochromatic light), 28 and 29 denote reflecting mirrors, 30 denotes an integrator, 31 denotes a reflecting mirror, 32 denotes a condenser lens, 33 denotes a mask holder holding the phase shift mask SM and slightly movable at least in Z-axis direction, and 34 denotes a reduction projection lens. Reference symbol 35 denotes a wafer adsorption base for making the semiconductor wafer 26 adhere thereto, 36 denotes a Z-axis movable base (height direction), 37 denotes an X-axis movable base (horizontally lateral direction), 38 denotes a Y-axis movable base (horizontally longitudinal direction). And, the X-axis movable base 37 and the Y-axis movable base 38 constitute an XY stage.

In the exposure processing, after a beam emitted from the KrF excimer laser 27 is curved by the two total reflecting mirrors 28 and 29, the light beam is converged by an optical element called integrator 30, enlarged, and made uniform. Next, after the beam is curved by the large-sized total reflecting mirror 31 and passed through both the condenser lens 32 made of quartz, an image is formed on the semiconductor wafer 26 through the phase shift mask SM and the monochrome reduction projection lens 34 made of quartz.

Figure 17:
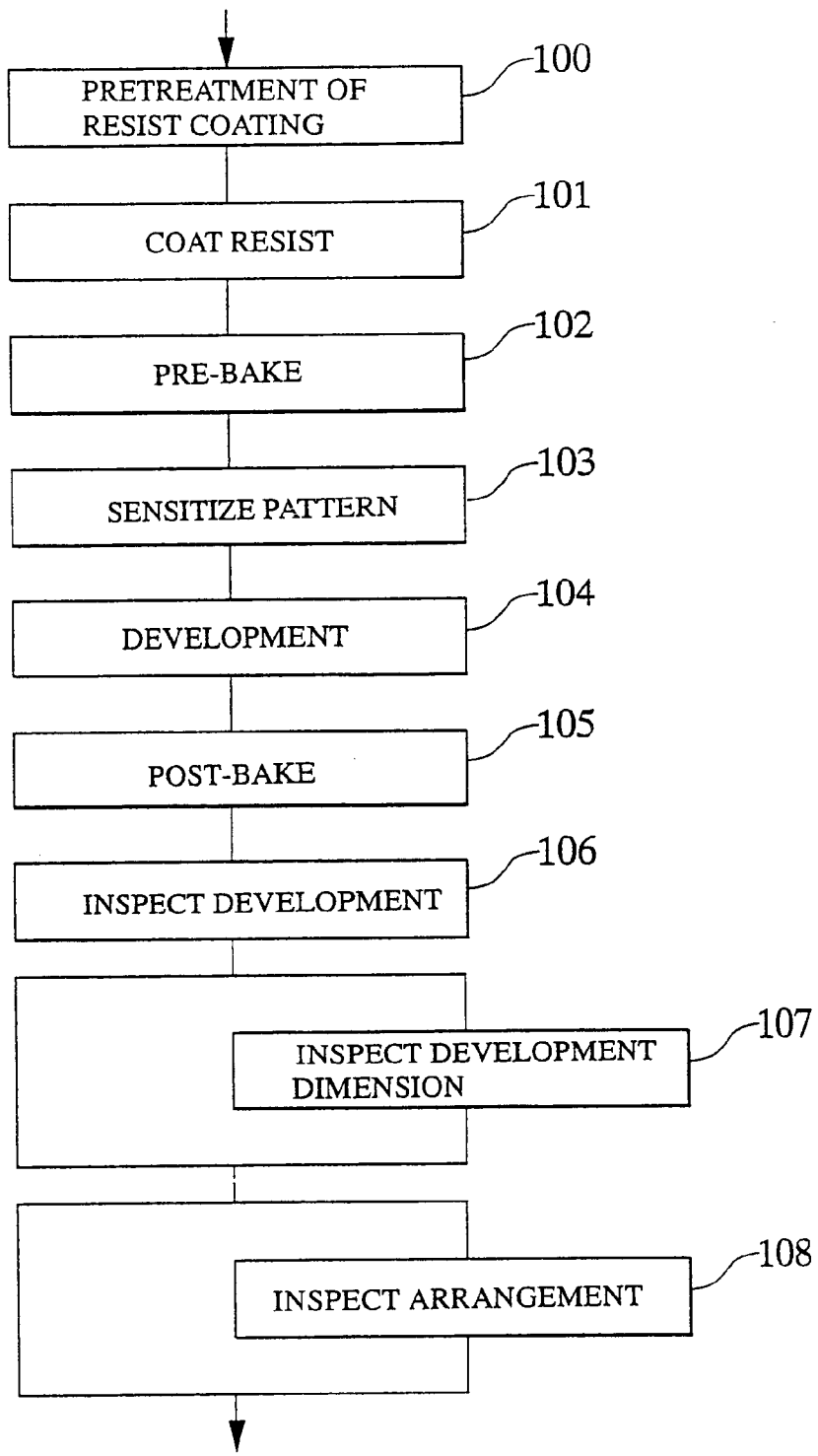
FIG. 17 is a step view for describing photolithography steps using the phase shift mask.

Next, description will be given to a manufacturing method of forming sets of lateral wiring (lower layer wiring) and sets of longitudinal wiring (upper layer wiring) on the semiconductor wafer by using the phase shift mask manufactured in accordance with the above-mentioned mask pattern design data, with reference to FIGS. 17 to 19.

First, a photolithography step executed during formation of the sets of lateral wiring, will be described by, referring to Steps 100 to 108 shown in FIG. 17 and a cross-sectional view of the important parts of the semiconductor wafer shown in FIG. 18.

First, contaminant on the front and rear surfaces of the semiconductor wafer 43 is removed. And, after the development treatment is completed, a resist coating pretreatment for intensifying the adhesion of the resist film pattern to the semiconductor wafer is carried out (in Step 100). A metallic film (e.g., an aluminum alloy film, a copper film or a tungsten film) 45 is formed on the semiconductor wafer 43 through an insulating film 44.

Figure 18:
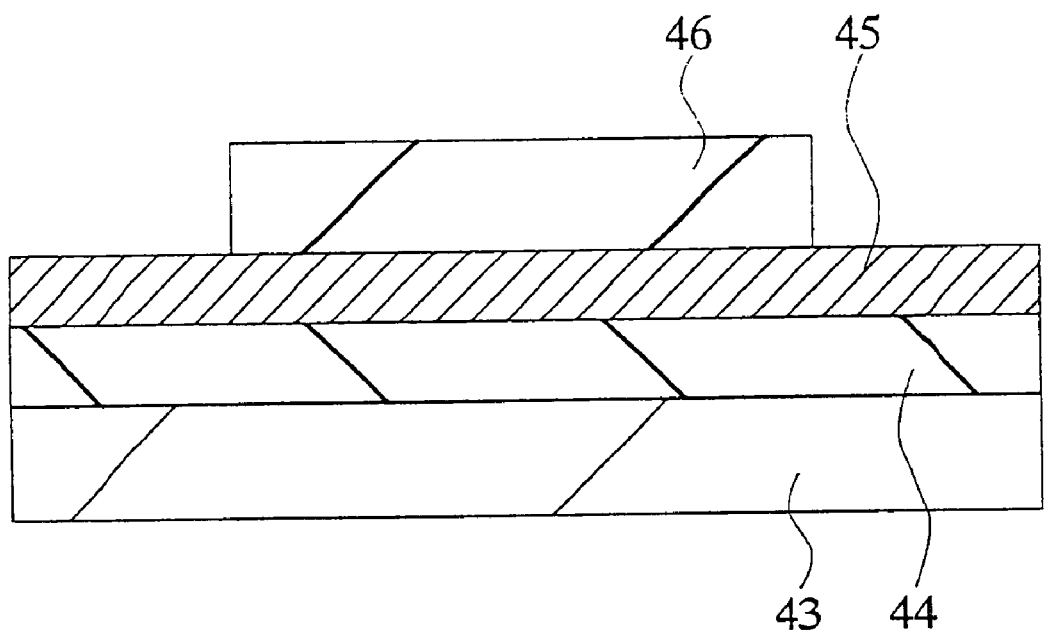
FIG. 18 is a cross-sectional view of the important parts of a semiconductor wafer for describing a wiring layer manufacturing method.

Next, as shown in FIG. 18, by a spin coating method, a resist film 46 having a thickness of 1 to 2 μm is uniformly coated on the semiconductor wafer 43 on which the coating pretreatment has been completed (in Step 101). In this method, after the semiconductor wafer 43 is put on a spin chuck and the resist of 1 to 5 ml is dropped, the semiconductor wafer 43 is rotated at 2000 to 5000 rpm, and the resist is scattered by a centrifugal force to form a resist film 46 on the surface of the semiconductor wafer 43.

While photoresist materials used for the manufacture of a semiconductor device are a negative type ultraviolet resist and a positive type ultraviolet resist, the positive type ultraviolet resist is mainly used for obtaining high resolution.

Next, much residual solvent included in the resist film 46 directly after coating is volatilized, and the semiconductor wafer 43 is baked by using a hot plate in order to stabilize a photo-chemical reaction during exposure (in Step 102).

Next, the semiconductor wafer 43 together with a predetermined phase shift mask is mounted on the above-mentioned reduction projection exposure system 25, is accurately positioned, and then KrF excimer laser having a wavelength of 0.248 μm is irradiated for given time to print a mask pattern (in Step 103).

Thereafter, developer is dropped on the surface of the semiconductor wafer 43 and is filled the surface thereof for surface tension, and a development treatment is conducted for predetermined time. Then, both rinse with pure water and rotational drying are continuously carried out (in Step 104). As a result, the resist film 46 in a region which takes a sharp amplitude intensity of light occurring during exposure, is removed and a wiring pattern is formed on the resist film 46.

Next, the semiconductor wafer 43 is baked at about 120° C. to be completely dried and to improve dry etching resistance due to the adhesion of the resist film 46 to the semiconductor wafer 43 and the transformation thereof to thermally cross-linking macromolecular structure (in Step 105).

Then, the semiconductor wafer 43 is visually inspected by a metallurgical microscope (in Step 106). An occasion arises, both the dimension and arrangement of the wiring pattern formed on the resist film are inspected (in Steps 107 and 108).

Next, etching steps used during formation of sets of lateral wiring will be described with reference to the cross-sectional view of the important parts of the semiconductor wafer shown in FIG. 19.

First, surface treatments of the semiconductor wafer 43 are carried out so as to ensure good etching. A typical one of the surface treatments is, for example, an $O_2$ plasma treatment for removing residue (scum) generated at the time of developing the resist film.

Figure 19:
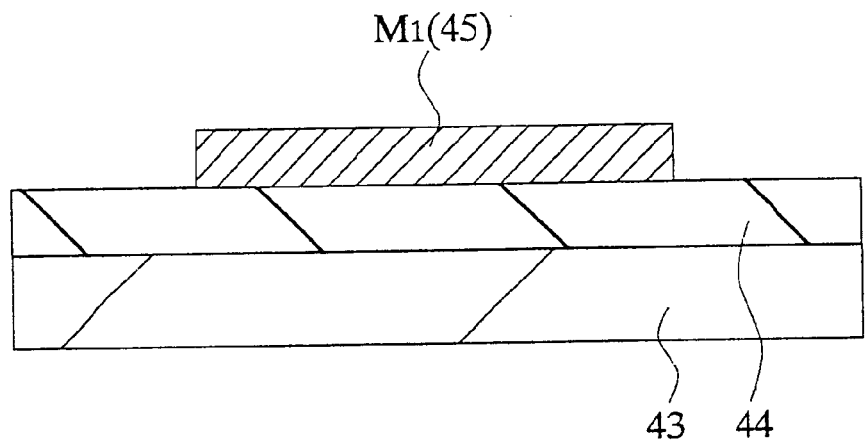
FIG. 19 is a cross-sectional view of the important parts of a semiconductor wafer for describing a wiring layer manufacturing method.

Next, as shown in FIG. 19, by using the patterned resist film 46 as a mask, a metallic film 45 provided on the semiconductor wafer 43 is removed by a dry etching method to form a set of lateral wiring $M_1$.

If the metallic film 45 is constituted by an aluminum alloy film, the aluminum alloy film is etched by a microwave plasma etching method using Cl system gas such as mixture gas of $BCl_3 + Cl_2$.

Next, the resist film 46 that has become unnecessary is stripped off from the semiconductor wafer 43 by an ash removal method for becoming ash by oxygen plasma. Thereafter, a cleaning treatment is carried out so as to remove a sidewall protection film or micro contaminant on the surface of the semiconductor wafer 43, which is not completely removed by the ash removal method and which is adhered to the wafer 43 during the etching steps. The cleaning treatment is, for example, a $CH_3COOH:NH_4OH:H_2O$ cleaning method or the like.

Next, the semiconductor wafer 43 is visually inspected by the metallurgical microscope in order to discover an appearance defect as early as possible and to prevent the contaminated semiconductor wafer 43 from being used in the next step. As a result, the set of lateral wiring $M_1$ in the layout shown in, for example, FIG. 3 is formed on the semiconductor wafer 43.

Next, after an interlayer insulating film is formed on the semiconductor wafer 43 by a CVD (Chemical Vapor Deposition) method, a sputtering method or the like, contact holes are formed in the interlayer insulating film. Thorough these contact holes, the set of lateral wiring $M_1$ is connected to sets of longitudinal wiring to be formed later.

Figure 20:
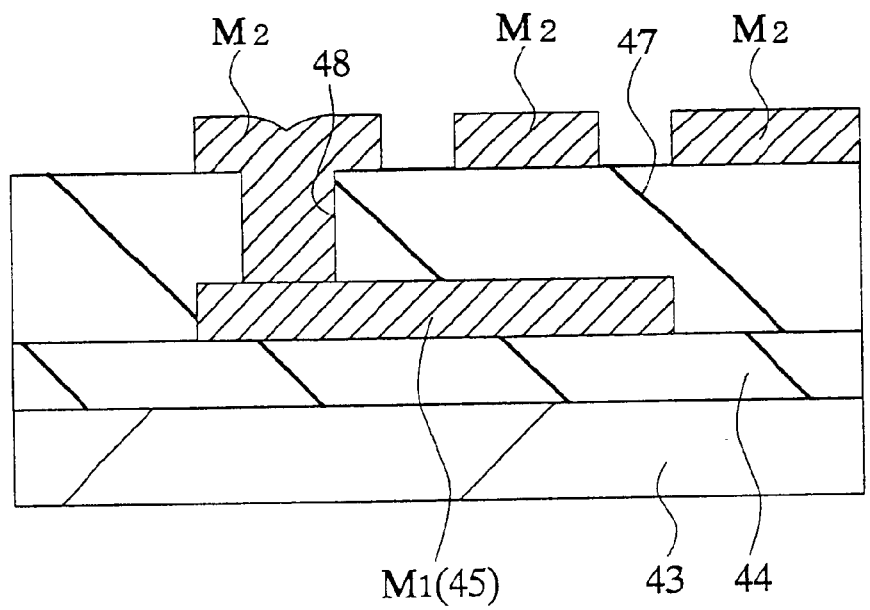
FIG. 20 is a cross-sectional view of the important parts of a semiconductor wafer for describing a wiring layer manufacturing method.

Next, a photolithography step and a dry etching step executed during formation of the above-mentioned contact holes will be described with reference to the cross-sectional view of the important parts of the semiconductor wafer shown in FIG. 20.

First, similarly to the manufacturing method which has been described with reference to FIGS. 17 and 18, the patterned resist film is formed on the semiconductor wafer 43. Next, after a surface treatment is conducted to the semiconductor wafer 43 in order to ensure good etching, the interlayer insulating film 47 formed on the semiconductor wafer 43 is removed by using the patterned resist film as a mask and by a dry etching method, and thereby contact holes 48 are formed in the interlayer insulating film 47.

If the interlayer insulating film 47 is constituted by a silicon oxide film ($SiO_2$), the silicon oxide film is etched by the microwave plasma etching method using, for example, mixture gas of $CF_4$ and $H_2$, gas of $CHF_3$ or the like. Then, a little damage ash treatment for slightly etching the surfaces of the set of lateral wiring Ml is carried out in order to remove damaged layers on the surfaces of the set of lateral wiring $M_1$.

Next, the resist film which has become unnecessary is stripped off from the semiconductor wafer 43 by the ashing removal method for becoming ash by oxygen plasma. Thereafter, a cleaning treatment is carried out in order to remove metal ions or micro contaminant which is not completely removed by the ash removal method and which is adhered to the surface of the semiconductor wafer during the etching steps. The cleaning treatment is conducted by, for example, an $NH_4OH/H_2O_2$ cleaning method, an $HCl/H_2O_2$ cleaning method, an $NH_4OH/CH_3COOH$ cleaning method or the like. Next, the semiconductor wafer 43 is visually inspected by the metallurgical microscope and contact holes 48 are formed.

Then, after a metallic film is formed on the semiconductor wafer 43, similarly to the manufacturing method which has been described with reference to FIGS. 17 and 18, a patterned resist film is formed on the semiconductor wafer 43. And, similarly to the manufacturing method which has been described with reference to FIG. 19, by processing the metallic film, sets of longitudinal wiring $M_2$ on the semiconductor wafer 43 are formed. Thus the set of lateral wiring $M_1$ and the sets of longitudinal wiring $M_2$ shown in FIG. 20 are formed.

As can be seen from the above description, according to the present embodiments, the interval between the set of short wiring and the set of long wiring is determined in accordance with the layout rules using the Levenson type phase shift. It is, therefore, possible to make the above-mentioned interval narrower than an interval determined in accordance with the layout rules which do not use the Levenson type phase shift, and to reduce the area of the wiring region. Also, since the number of sets of long wiring adjacent to each other and provided in parallel is decreased and the interval between the adjacent sets of long wiring is determined in accordance with the layout rules which do not use the Levenson type phase shift, it is possible to prevent the sets of long wiring from extending in proximity to each other and to suppress an increase in parasitic capacity of each set of long wiring to prevent an increase in delay time.

If the ratio of the sets of long wiring and the sets of short wiring in one wiring region is, for example, 7:3, it is possible to apply the method of the present invention to 60% of the wiring region. In this case, in comparison with the layout formed without using the Levenson type phase shift, the area of the wiring region can be reduced to 22.5% at the a maximum. On the other hand, the width of each set of long wiring and the interval between adjacent sets of long wiring are determined by applying to the layout which does not use the Levenson type phase shift. Therefore, it is possible to suppress an increase in the parasitic capacity of each set of wiring.

Furthermore, at the time of manufacturing a phase shift mask, wiring tracks different in phase are alternately arranged in advance so as to invert each phase of adjacent patterns, and the sets of short wiring and the sets of long wiring are alternately allotted to the wiring tracks. Due to this, no contradictory portion occurs and no number of steps of correcting the layout thereof occurs.

The invention made by the inventor of the present application has been described concretely on the basis of the embodiments of the invention so far. Needless to say, the present invention is not limited by the above-mentioned embodiments and various changes and modifications can be made without departing the gist of the invention.

INDUSTRIAL APPLICABILITY

According to the present invention, it is possible to prevent an increase in the parasitic capacity of each set of wiring and to narrow the arrangement interval between the sets of wiring. As a result, it is possible to reduce the area of a semiconductor chip and to make the absolute value of the parasitic capacity of each set of wiring low, so that actual loading simulation is relatively improved in accuracy, and TAT (Turn Around Time) necessary for completing a product is shortened.

Furthermore, according to the present invention, no contradiction occurs to the placement of the phase shift mask, no number of sets of correcting the layout occurs and phase shift mask design operation can be carried out efficiently.

What is claimed is:

1. A manufacturing method of semiconductor integrated circuit device, comprising the steps of:

dividing a set of signal wiring into a set of long wiring and a set of short wiring by comparison with a reference value;

arranging said set of long wiring in parallel to said set of short wiring and in proximity to at least one side of said set of short wiring;

forming a set of signal wiring in a wiring region included in a semiconductor chip;

making a layout rule of said set of long wiring different from a layout rule of said set of short wiring; and making an interval between a set of long wiring and a set of short wiring provided in parallel and in proximity thereto relatively narrower than an interval between sets of long wiring arranged in parallel to each other, by using a Levenson type phase shifter to expose a pattern of said set of short wiring on a photomask.

2. The manufacturing method of a semiconductor integrated circuit device according to claim 1, further comprising the steps of:

making a layout rule of said set of long wiring different from a layout rule of said set of short wiring; and making a width of said set of short wiring 0.3 to 1.0 times as large as a width of said set of long wiring, by using a Levenson type phase shifter to expose a pattern of said set of short wiring on a photomask.

3. The manufacturing method of a semiconductor integrated circuit device according to claim 1, further comprising the steps of:

making a wiring layer constituting a set of signal wiring extending in lateral direction different from a wiring layer constituting a set of signal wiring extending in longitudinal direction; and connecting the wiring layer extending in the lateral direction and the wiring layer extending in the longitudinal direction, which constitute one net, through a contact hole provided in an interlayer insulating film between said wiring layer extending in the lateral direction and said wiring layer extending in the longitudinal direction.

4. The manufacturing method of a semiconductor integrated circuit device according to claim 1, wherein said reference value is K times as high as an average value of spreads of a net in the wiring region, M times as large as a width of an interior of the wiring region, N% of the spread of the net on a shorter side in a wiring length distribution, one of an allowable length of the set of short wiring in view of resistance characteristics determined by a current density of the set of wiring and an allowable length of the set of long wiring in view of capacitive characteristics, and a combination thereof.

5. A manufacturing method of semiconductor integrated circuit device, comprising the steps of:

dividing a set of signal wiring into a set of long wiring and a set of short wiring by comparison with a reference value;

arranging said set of long wiring in parallel to said set of short wiring and in proximity to at least one side of said set of short wiring;

forming a set of signal wiring in a wiring region included in a semiconductor chip;

making a layout rule of said set of long wiring different from a layout rule of said set of short wiring; and making a width of said set of short wiring 0.3 to 1.0 times as large as a width of said set of long wiring, by using a Levenson type phase shifter to expose a pattern of said set of short wiring on a photomask.

* * * * *